US010461633B2

(12) United States Patent
Sepahvand et al.

(10) Patent No.: US 10,461,633 B2
(45) Date of Patent: Oct. 29, 2019

(54) DC-TO-DC DRIVERS WITH HIGH RESOLUTION DIMMING

(71) Applicant: THE REGENTS OF THE UNIVERSITY OF COLORADO, Denver, CO (US)

(72) Inventors: Alihossein Sepahvand, Boulder, CO (US); Dragan Maksimovic, Boulder, CO (US); Khurram Afridi, Boulder, CO (US)

(73) Assignee: The Regents of the University of Colorado, a Body Corporate, Denver, CO (US)

( * ) Notice: Subject to any disclaimer, the term of this patent is extended or adjusted under 35 U.S.C. 154(b) by 0 days.

(21) Appl. No.: 16/027,846

(22) Filed: Jul. 5, 2018

(65) Prior Publication Data

US 2019/0013800 A1 Jan. 10, 2019

Related U.S. Application Data

(60) Provisional application No. 62/529,520, filed on Jul. 7, 2017.

(51) Int. Cl.
| | |
|---|---|
| *H03K 5/133* | (2014.01) |
| *H02M 3/00* | (2006.01) |
| *H02M 3/335* | (2006.01) |
| *H03K 7/08* | (2006.01) |
| *H05B 33/08* | (2006.01) |

(52) U.S. Cl.
CPC ....... *H02M 3/005* (2013.01); *H02M 3/33507* (2013.01); *H02M 3/33576* (2013.01); *H03K 7/08* (2013.01); *H05B 33/0815* (2013.01)

(58) Field of Classification Search
CPC .......... H03K 5/133; H03K 7/08; H02M 3/157
(Continued)

(56) References Cited

U.S. PATENT DOCUMENTS

| | | | | |
|---|---|---|---|---|
| 6,225,795 B1* | 5/2001 | Stratakos | .............. | H02M 3/156 323/283 |
| 2009/0309567 A1* | 12/2009 | Morroni | ................ | H02M 3/157 323/283 |

(Continued)

OTHER PUBLICATIONS

Corradini, "A High-Frequency Digitally Controlled LED Driver for Automotive Applications With Fast Dimming Capabilities", IEEE Trans. Power Electron., vol. 29, No. 12, pp. 6648-6659, Dec. 2014.*

(Continued)

*Primary Examiner* — Juan A Torres
(74) *Attorney, Agent, or Firm* — Saul Ewing Arnstein & Lehr LLP; Kathryn Doyle; Brian R. Landry

(57) ABSTRACT

One aspect of the invention provides a DC-to-DC driver including: a converter including an output configured to drive a load with an output current; and a feedback controller coupled to the converter. The feedback controller includes: a pulse-width modulator configured to output a first pulse-width modulated signal to the converter; a first switching mechanism coupled to the pulse-width modulator; a compensator having an output coupled to the first switching mechanism, the compensator configured to generate a first duty cycle control signal based on a comparison of the output current and a first reference voltage; and a sampler having an input coupled to the output of the compensator and an output coupled to the switching mechanism, the sampler configured to generate a second duty cycle control signal based on the first duty cycle control signal.

20 Claims, 22 Drawing Sheets

(58) Field of Classification Search
USPC .......................................................... 375/238
See application file for complete search history.

(56) References Cited

U.S. PATENT DOCUMENTS

| | | | | |
|---|---|---|---|---|
| 2010/0033420 | A1* | 2/2010 | Jheng | G09G 3/3406 345/102 |
| 2011/0050185 | A1* | 3/2011 | Notman | H02M 3/1588 323/271 |
| 2014/0139296 | A1* | 5/2014 | Marsili | H02M 3/158 332/109 |

OTHER PUBLICATIONS

Hsia, "Auto tracking DC/DC converter for adaptive LED driving system" 2017 IEEE Wireless Power Transfer Conference (WPTC) May 10-12, 2017 pp. 1-4.*

Sung, discloses "A white LED backlight driving IC with 3-bit dimming controller" 2011 3rd Asia Symposium on Quality Electronic Design (ASQED). Year: 2011 pp. 79-84.*

Patterson, discloses "Current control and PWM dimming in an automotive LED driver based on a Ćuk converter" Jul. 9-12, 2017 IEEE 18th Workshop on Control and Modeling for Power Electronics (COMPEL) pp. 1-8.*

Ouyang, Z., et al.,"Advances in Planar and Integrated Magnetics", Technical University of Denmark, 2011, 229 pages.

Perreault, D. J., et al., "Opportunities and Challenges in Very High Frequency Power Conversion", in Proceedings of IEEE, 2009, 15 pages.

Sepahvand, A., et al., High-Frequency ZVS Ćuk Converter for Automotive LED-Driver Applications Using Planar Integrated Magnetics, SELECT Annual Meeting and Technology Showcase—Logan, Utah ,Sep. 27-28, 2016.

Sepahvand, A., "High Frequency DC-DC Power Conversion for Automotive LED Driver Applications", Ph.D. Defense Exam, University of Colorado, Mar. 20, 2017.

* cited by examiner

DC-TO-DC DRIVERS WITH HIGH RESOLUTION DIMMING

CROSS-REFERENCE TO RELATED APPLICATION

This application claims priority under 35 U.S.C. § 119(e) to U.S. Provisional Patent Application Ser. No. 62/529,520, filed Jul. 7, 2017. The entire content of this application is hereby incorporated by reference herein.

BACKGROUND OF THE INVENTION

Light-emitting diodes (LEDs) with DC-to-DC drivers are increasingly used in many applications relative to conventional incandescent lamps, as LED-based lighting solutions result in lower power consumption, longer lifetime, and additional flexibility. Specifically, LEDs are becoming more common within automotive applications.

LEDs are commonly driven by DC-to-DC drivers that are designed to operate over a wide range of output and input voltages. Further, DC-to-DC drivers also need to provide precise regulation of LED (output) current and high resolution dimming in order to vary the LEDs' light intensity without adverse optical effects such as flicker. Further, for automotive applications, DC-to-DC drivers must be designed to meet challenging electromagnetic interference (EMI) requirements, as conventional DC-to-DC drivers may raise issues with AM radio interference. However, current DC-to-DC designs are unable to meet all of these requirements.

SUMMARY OF THE INVENTION

One aspect of the invention provides a DC-to-DC driver including: a converter including an output configured to drive a load with an output current; and a feedback controller coupled to the converter. The feedback controller includes: a pulse-width modulator configured to output a first pulse-width modulated signal to the converter; a first switching mechanism coupled to the pulse-width modulator; a compensator having an output coupled to the first switching mechanism, the compensator configured to generate a first duty cycle control signal based on a comparison of the output current and a first reference voltage; and a sampler having an input coupled to the output of the compensator and an output coupled to the switching mechanism, the sampler configured to generate a second duty cycle control signal based on the first duty cycle control signal. The switching mechanism selectively couples one of the compensator and the sampler with the pulse-width modulator based at least in part on a dimming signal.

This aspect of the invention can have a variety of embodiments. The converter can further include a switch network including a first operating state and a second operating state and configured to selectively operate in the first operating state and the second operating state at least partially based on the dimming signal. The pulse-width modulator can be configured to output the first pulse-width modulated signal to the switch network. The switch network can include: a first transistor having a first gate; a second transistor having a second gate; and at least one gate driver coupled to the first gate and the second gate. In the first operating state, the first gate and the second gate can be driven by the at least one gate driver. In the second operating state, the first gate and the second gate can be driven below a turn-on voltage for the transistor. The driver can further include an off-state comparison network including a first comparator configured to compare the output current to a reference current, wherein the switch network is configured to switch from operating in the first operating state to operating in the second operating state at least partially based on the comparison and the dimming signal.

The dimming signal can include a duty cycle based on a parameter of the load. The load can be one or more light-emitting diodes (LEDs) and the parameter can be a brightness level.

The pulse-width modulator can generate the first pulse-width modulated signal based on the first duty cycle control signal and be configured to generate a second pulse-width modulated signal based on the second duty cycle control signal. The first pulse-width modulator signal can include a first duty cycle and the second pulse-width modulation signal can include a second duty cycle different than the first duty cycle. The second duty cycle can be a portion of a steady state value of the first duty cycle.

The driver can further include a steady state comparison network including a second comparator configured to compare the output current with a steady state reference current and generate a steady state output signal. The switching mechanism can selectively couple one of the comparator and the sampler with the pulse-width modulator based on the dimming signal and further based on the steady state output signal.

The comparator can include a reference input selectively coupled to the first reference voltage and a second reference voltage. The reference input can be switched from being selectively coupled to the second reference voltage to the first reference voltage based at least in part on the dimming signal.

The converter can be an integrated magnetics Ćuk converter.

Another aspect of the invention provides a lighting system including: one or more light emitting diodes (LEDs); and the driver of any of the embodiments of the invention described herein electronically coupled to and configured to drive the one or more LEDs.

Another aspect of the invention provides a feedback controller of a DC-to-DC driver including a converter and configured to drive a load with an output signal. The controller is configured to: compare the output signal with a first reference signal; generate a first control signal based on the comparison of the output signal and the first reference signal and a dimming signal; and switch from outputting to the converter a first pulse-width modulated signal having a first duty cycle to outputting a second pulse-width modulated signal having a second duty cycle different than the first based on the first control signal.

This aspect of the invention can have a variety of embodiments. The first pulse-width modulated signal can be based on a first duty cycle control signal and the second pulse-width modulated signal can be based on a second duty cycle control signal.

The controller can be further configured to sample a steady state value of the first duty cycle control signal and generate the second pulse-width modulated signal based on the steady state value.

The reference signal can correspond to a threshold current. The threshold current can correspond to an off state of the load. The threshold current can correspond to a steady state of the load.

The controller can be further configured to switch a switching network of the converter from operating in a first operating state to operating in a second operating state based on the control signal.

The controller can be configured to selectively couple an input of a comparator of the converter to a first reference voltage and a second reference voltage based on one of the dimming signal and the control signal.

Another aspect of the invention provides a lighting system including: one or more light emitting diodes (LEDs); and the driver of any of the embodiments of the invention described herein electronically coupled to and configured to drive the one or more LEDs.

Another aspect of the invention provides a DC-to-DC driver including: a converter including an output coupled to a load, and having a first operating state and a second operating state, the converter configured to drive the load with an output current; and a feedback controller coupled to converter and configured to selectively output a first pulse-width modulated signal and a second pulse-width modulated signal to the converter and receive a dimming signal. The first pulse-width modulated signal includes a first duty cycle and the second pulse-width modulated signal includes a second duty cycle different than the first duty cycle. The converter is configured to switch from operating in the first state to operating in the second state based at least in part on the dimming signal. The feedback controller is configured to selectively output the first pulse-width modulated signal and the second pulse-width modulated signal at least partially based on dimming signal.

This aspect of the invention can have a variety of embodiments. The feedback controller can be configured to output the first pulse-width modulated signal when the dimming signal is at a high level. The feedback controller can be configured to output the first pulse-width modulated signal when the dimming signal is at a low level.

The feedback controller can be configured to compare the output current with a reference current to generate a first control signal. The feedback controller can be configured to output the second pulse-width modulated signal when the dimming signal is at a low level and the output current is less than the reference current. The feedback controller can be configured to output the first pulse-width modulated signal when the dimming signal is at a high level and the output current is greater than the reference current.

DRAWINGS

For a fuller understanding of the nature and desired objects of the present invention, reference is made to the following detailed description taken in conjunction with the accompanying drawing figures wherein like reference characters denote corresponding parts throughout the several views.

DEFINITIONS

The instant invention is most clearly understood with reference to the following definitions:

As used herein, the singular form "a," "an," and "the" include plural references unless the context clearly dictates otherwise.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from context, all numerical values provided herein are modified by the term about.

As used in the specification and claims, the terms "comprises," "comprising," "containing," "having," and the like can have the meaning ascribed to them in U.S. patent law and can mean "includes," "including," and the like.

Unless specifically stated or obvious from context, the term "or," as used herein, is understood to be inclusive.

Ranges provided herein are understood to be shorthand for all of the values within the range. For example, a range of 1 to 50 is understood to include any number, combination of numbers, or sub-range from the group consisting 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 (as well as fractions thereof unless the context clearly dictates otherwise).

EQUIVALENTS

Although preferred embodiments of the invention have been described using specific terms, such description is for illustrative purposes only, and it is to be understood that changes and variations may be made without departing from the spirit or scope of the following claims.

DETAILED DESCRIPTION OF THE INVENTION

Automotive applications of LEDs commonly require that a corresponding DC-to-DC driver be able to provide a precise output current and the ability to vary the brightness of the LEDs without introducing optical affects such as flicker. As such, the converters of such DC-to-DC drivers need to be able to quickly turn on and turn off an output current. In many instance, DC-to-DC drivers with these characteristics are not limited to automotive applications and can be applied to any application having such requirements.

Figure 1:
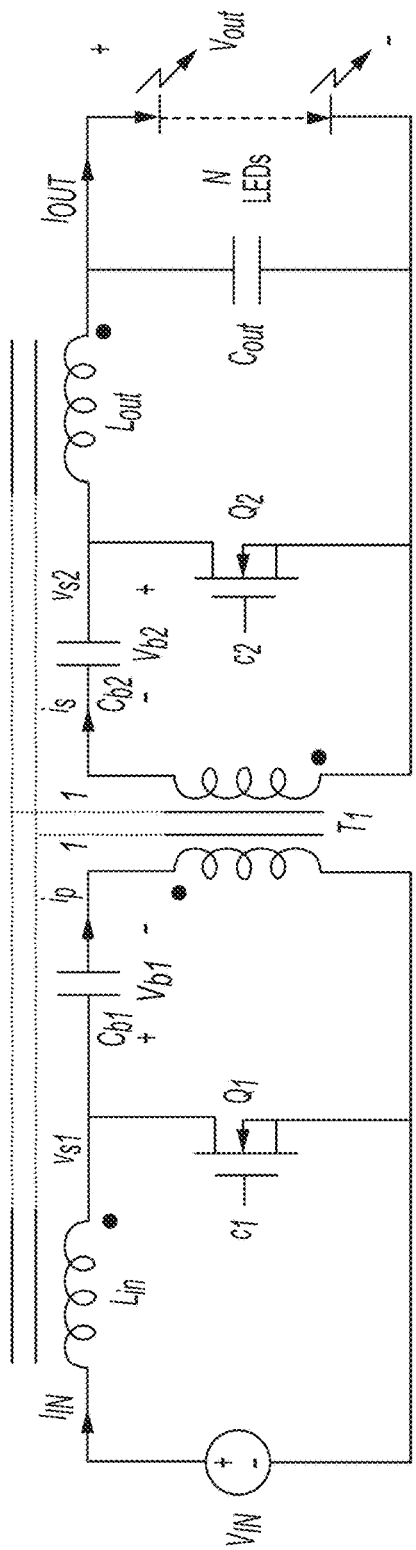
FIG. 1 illustrates an integrated magnetics Ćuk converter.

FIG. 1 illustrates an integrated magnetics Ćuk converter that provides buck and boost capabilities as well inherent input and output current filtering. The Ćuk converter of FIG. 1 is an attractive topology for LED driver applications where all three magnetic components ($L_{in}$, $L_{out}$ and the transformer) are integrated on a single magnetic structure, which may be designed to minimize the input and output current ripples. This reduces the input and output capacitance requirements improving the converter's dynamic performance. Further, the transistors in an integrated magnetic Ćuk converter can be operated with zero-voltage switching (ZVS) over wide input and output voltage ranges. In various embodiments, the integrated magnetics Ćuk converter is well-suited for high-resolution pulse-width modulation (PWM) dimming, as the integrated magnetics Ćuk converter includes a very small output filter capacitance, providing fast transient response capabilities.

State-spaced equations of the integrated magnetics structure may be solved under the zero-ripple condition to obtain the effective inductances of the input and output inductor ports, which may be expressed, respectively as:

$$L_{in,eff} = -\frac{L_{14}^2 L_{33} + 2L_{14}L_{13}L_{34} + L_{11}L_{34}^2 + L_{13}^2 L_{44} - L_{11}L_{33}L_{44}}{-L_{14}^2 + L_{14}L_{13} + L_{11}L_{34} - L_{14}L_{34} + L_{11}L_{44} - L_{13}L_{44}}, \quad \text{Equation 1}$$

$$L_{out,eff} = -\frac{L_{14}^2 L_{33} + 2L_{14}L_{13}L_{34} + L_{11}L_{34}^2 + L_{13}^2 L_{44} - L_{11}L_{33}L_{44}}{L_{14}L_{13} - L_{13}^2 + L_{11}L_{33} - L_{14}L_{33} + L_{11}L_{34} - L_{13}L_{34}}, \quad \text{Equation 2}$$

where, $L_{11}$, $L_{22}$, $L_{33}$ and $L_{44}$ are the self inductances of the transformer primary, secondary, input filter inductor, and output filter inductor windings, respectively. Further, $L_{ij}$ is the mutual inductance between winding i and j. The effective inductances given by Equations 1 and 2 are significantly larger than the self-inductances of the input and output inductors. For instance, a 2 µH input inductor appears effectively as a 4.58 µH inductor, and a 2.8 µH input inductor appears effectively as a 7.56 µH inductor. The ripple in the input and output currents can be expressed in terms of the effective input and output inductances as:

$$\Delta I_{in} = \frac{V_{in}D'}{2L_{in,eff}f_{sw}}, \quad \text{Equation 3}$$

$$\Delta I_{out} = \frac{V_{out}D'}{2L_{out,eff}f_{sw}}. \quad \text{Equation 4}$$

It can be seen from Equations 3 and 4 that since the effective input and output inductances are large, the input and output currents have small ripples. Therefore, in various embodiments, the integrated magnetics Ćuk converter has a very small input and output filter capacitances. In one embodiment, the small output capacitances allow the output voltage and current of the converter to be changed at fast rate, enabling the converter to be turned on and off very quickly, providing a converter suitable for high-resolution PWM dimming. In various embodiments, turn-on and turn-off transitions can be considered fast if they are substantially shorter than the PWM dimming period. The PWM dimming frequency $f_{dim}$ may typically be within a range of about 200 Hz to about 1 kHz, which is much lower than the converter switching frequency, but is sufficiently high so as to avoid undesirable optical effects such as flicker. For example, for a PWM frequency of 1 kHz, the PWM dimming period is 1 ms. In one or more embodiments, turn-off or turn-on times within around 1% of the dimming period, or within around 10 µs can be considered fast.

In various embodiments, a converter is included within a driver. For example, an integrated magnetics Ćuk converter may be included within an LED driver. The driver may have one or more feedback elements configured to adjust an output current based on changes within the drive load or an operating even (e.g., turn-on, turn-off, or increased or decreased dimming).

In one or more embodiments, the input voltage $V_{IN}$ varies from about 4.5 V (e.g., during a cold start) to more than about 45 V (e.g., during a "load dump"), while the output ranges from about 3 V to about 60 V, depending on the number LEDs, N, that are to be driven (e.g., N=1-18).

In one or more embodiments, feedback controller of the driver is configured to regulate the LEDs' current (e.g., with less than 10% ripple) over a wide range of voltages. Furthermore, in many embodiments, the output current of an LED driver is typically close to the LEDs' current rating. As a result, a small overshoot in the output current may cause the LED or LEDs to fail or age prematurely. Therefore, extra care needs to be taken to prevent transient overshoots in the output current. As such, the following embodiments employ PWM dimming to control the LED brightness. For example, the LEDs are turned on and off with a dimming frequency $f_{dim}$ and a dimming duty cycle $D_{dim}$. In various embodiments, the dimming frequency is selected above noticeable frequencies (>200 Hz) to avoid flicker, extending up to around 1 kHz.

In various embodiments, a closed-loop control architecture is presented for the integrated magnetics Ćuk converter, which enables the converter to achieve the aforementioned regulation and dimming. The integrated magnetics Ćuk converter of the present disclosure has non-minimum phase dynamics and, in a non-inverting Ćuk converter with a transformer, the magnetizing inductance adds additional conjugate poles and zeros to the converter's transfer functions. In one or more embodiments, the integrated magnetics Ćuk converter of this disclosure is a sixth-order system.

Figure 2:
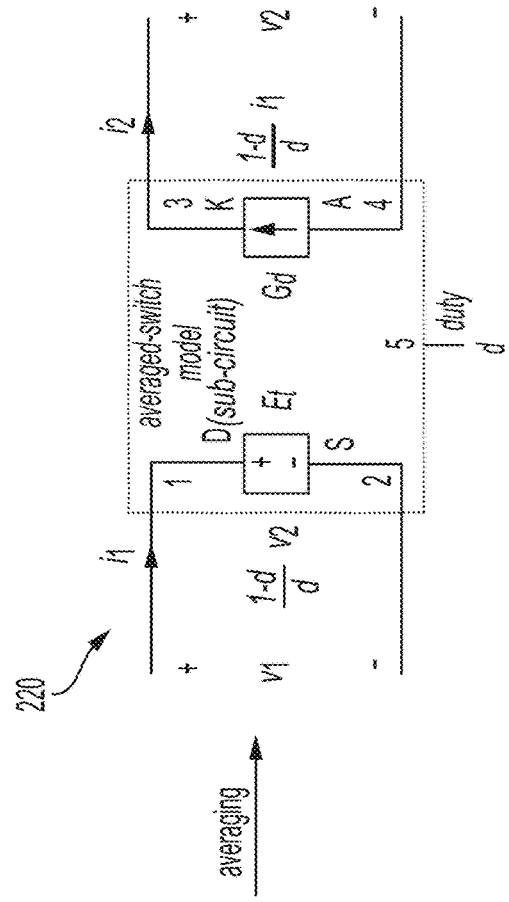
FIG. 2 illustrates an averaged switch model used to construct an averaged model an integrated magnetics Ćuk converter.
Figure 2:
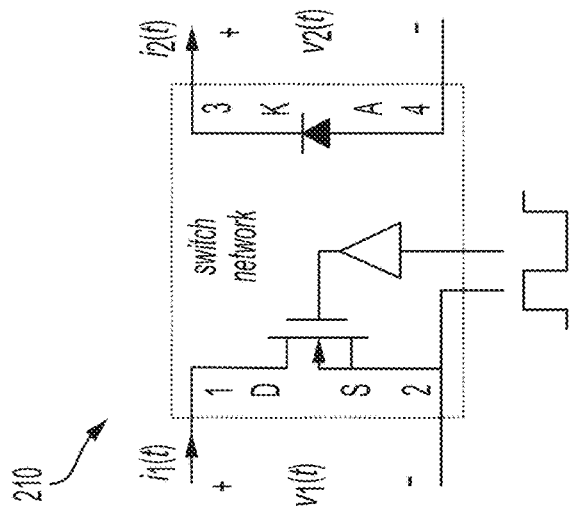

FIG. 2 illustrates an averaged switch network that can be used to model an integrated magnetics Ćuk converter. In this model, a general two-switch network (210) is represented using dependent voltage and current sources with the duty cycle d as a control input (220). A SPICE™ implementation of the averaged switched model is used to obtain the dynamics and, in particular, the duty-cycle-to-output-inductor-current transfer functions of the integrated magnetics Ćuk converter, given by:

$$G_{id}(s) = \frac{i_{L,out}(s)}{d(s)} \quad \text{Equation 5}$$

Figure 3:
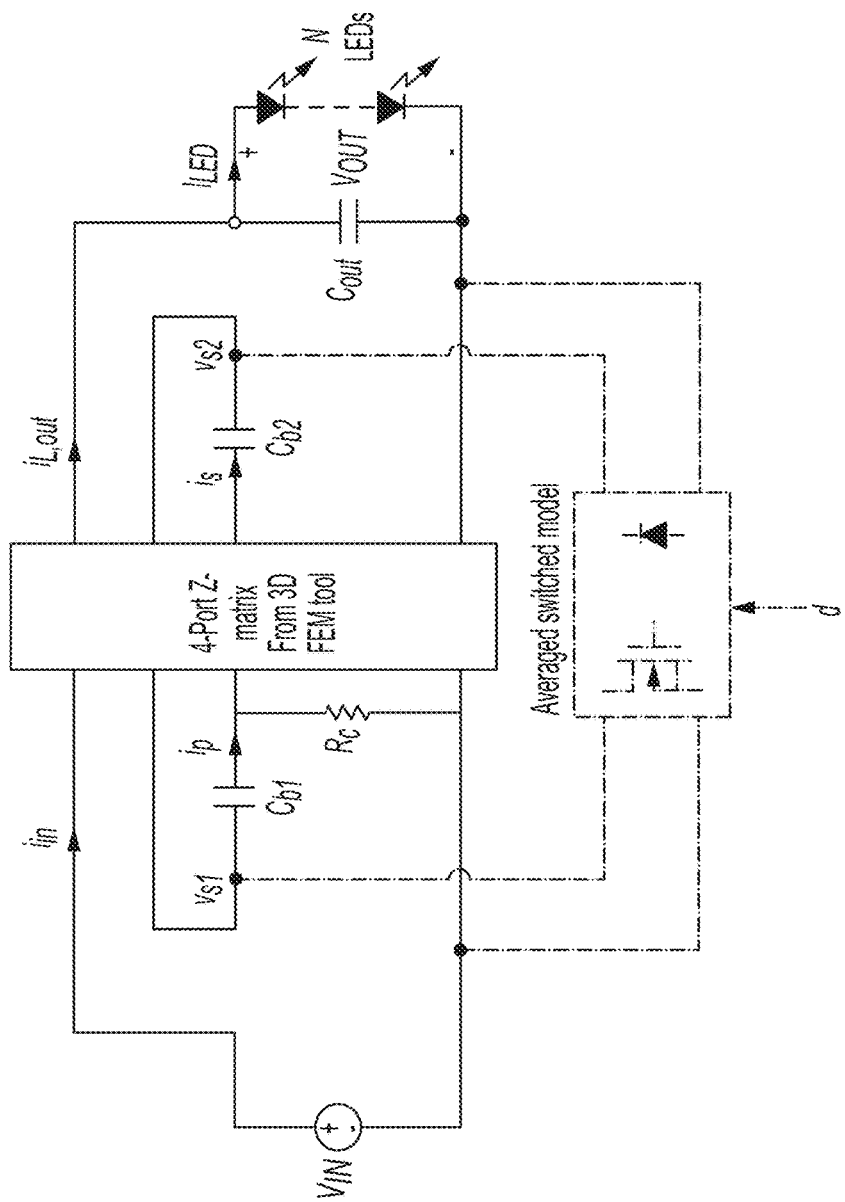
FIG. 3 illustrates a simulation setup for a converter averaged model.

In various embodiments, the converter has a very small output capacitor and the output inductor current is essentially equal to the LED current, which can be used as a control parameter. FIG. 3 illustrates a simulation setup. The converter's switch network (comprising transistors $Q_1$ and $Q_2$) is replaced by the average switch model, and the magnetic components ($L_{in}$, $L_{out}$ and the transformer are represented by the Spice model of the integrated magnetics structure obtained from 3D FEM analysis. Further, an additional resistor $R_c$ is introduced in parallel with the transformer's input port to model its core loss.

In one or more embodiments, the value of the resistance depends on the converter's input and output voltages, and can be computed by applying the improved Generalized Steinmetz Equation (iGSE) over the operating range of the converter.

Figure 4:
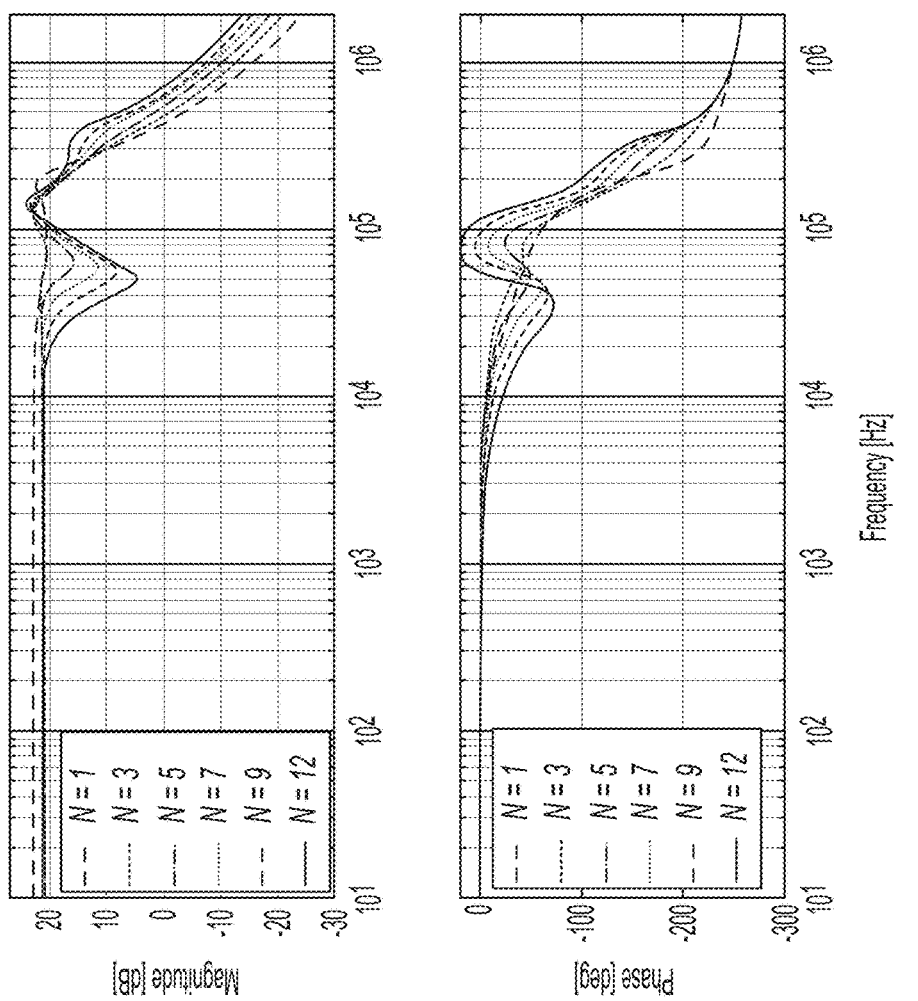
FIG. 4 shows duty-cycle to output inductor current transfer function of a DC-to-DC converter.

FIG. 4 shows duty-cycle to output inductor current transfer function for Equation 5, wherein $V_{IN}$=12 V, $V_{OUT}$=3 V to 50 V (N=1 to 12), and output current $I_{LED}$=0.5 A. As can be seen, the low frequency gain of the duty-cycle-to-output-inductor-current transfer function remains approximately constant regardless of changes in the output voltage. Since the approximate gain invariance is observed at a low frequency, it is not associated with the integrated magnetics structure, which predominantly modifies the higher-frequency dynamics of the converter.

The duty-cycle-to-output-inductor-current transfer function of this converter is given by:

$$G_{id}(s) = \frac{G_{id0}\left(1 - \frac{s}{Q_z w_z} + \frac{s^2}{w_z^2}\right)}{\left(1 - \frac{s}{Q_p wp} + \frac{s^2}{w_p^2}\right)\left(1 = \frac{s}{w_{p2}}\right)}, \quad \text{Equation 6}$$

where the low-frequency (DC) gain is $$G_{id0} = \frac{DD'V_c + D'^2 V_c}{D'^2 \frac{V_{OUT}}{I_{LED}}}, \quad \text{Equation 7}$$

and $V_C = V_{IN} + V_{OUT}$. Simplifying Equation 7 results in:

$$G_{id,0} = \frac{I_{LED}}{DD'}. \quad \text{Equation 8}$$

Figure 5:
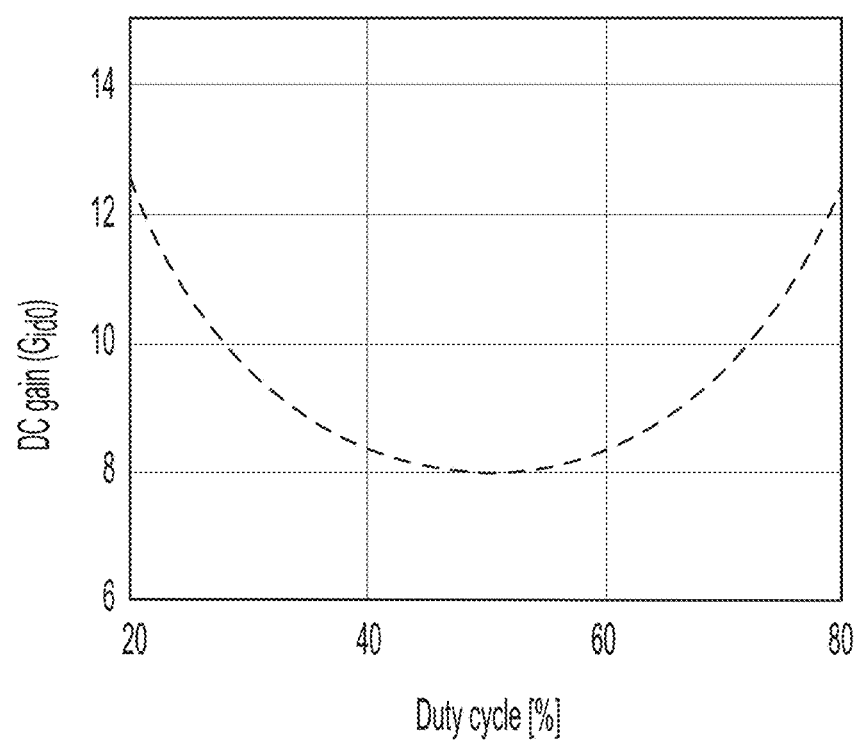
FIG. 5 illustrates a plot of the low-frequency gain versus duty cycle for a DC-to-DC converter.

FIG. 5 illustrates a plot of the low-frequency gain versus duty cycle. It can be seen that as the duty cycle D varies from 20% to 80%, representing a corresponding variation in the converter's output voltage, the low-frequency gain changes by about 4 dB. The transfer function of the integrated magnetics Ćuk converter exhibits a similar low-frequency behavior.

Figure 6:
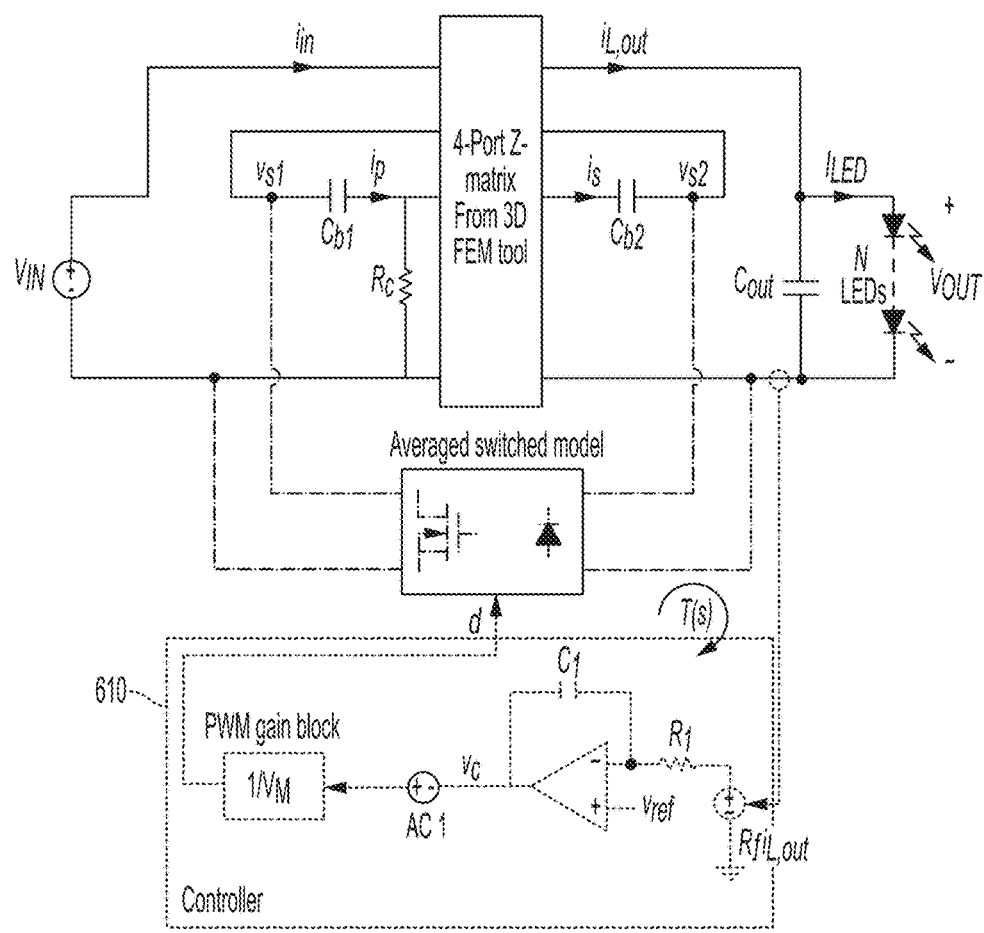
FIG. 6 illustrates an embodiment of a DC-to-DC driver having a closed-loop controller.

FIG. 6 illustrates an embodiment of a closed loop controller 610 configured to regulate the output current of a converter. While a Ćuk converter is illustrated in FIG. 6, the closed loop controller 610 may be configured to regulate the output current of other types of converters such as buck converters, boost converters, buck-boost converters, noninverting buck-boost converters, Zeta converters, SEPICs (single-ended primary-inductor converters), resonant converters or the like. The closed loop controller 610 senses the output inductor current, which is compared with a current reference, and the error is processed by an integral compensator. The output of the compensator is fed into a pulse-width modulator (PWM), which provides the modulated duty cycles for the two transistors, $Q_1$ and $Q_2$. As can be seen from FIG. 6, a test signal source is inserted at the compensator output to measure the loop gain of the system. The integral compensator ensures that the output current reference is tracked accurately in steady state, and is designed such that the loop gain has a crossover frequency of 15 kHz, below the resonant poles and zeros of the open loop transfer function shown in FIG. 4, while providing a phase margin of φ=57° at the worst case operating point (e.g., $V_{OUT}$=50 V corresponding to number of LEDs N=12), where the phase of the open loop transfer function is the lowest, as also shown in FIG. 4. Configuring the closed loop controller 610 based on this phase margin ensures a fast transient response with minimal overshoot in the LED current. Furthermore, since the low frequency gain of the open loop transfer function varies over a relatively narrow range in response to changes in the number of LEDs, the crossover frequency also remains approximately constant.

Figure 7:
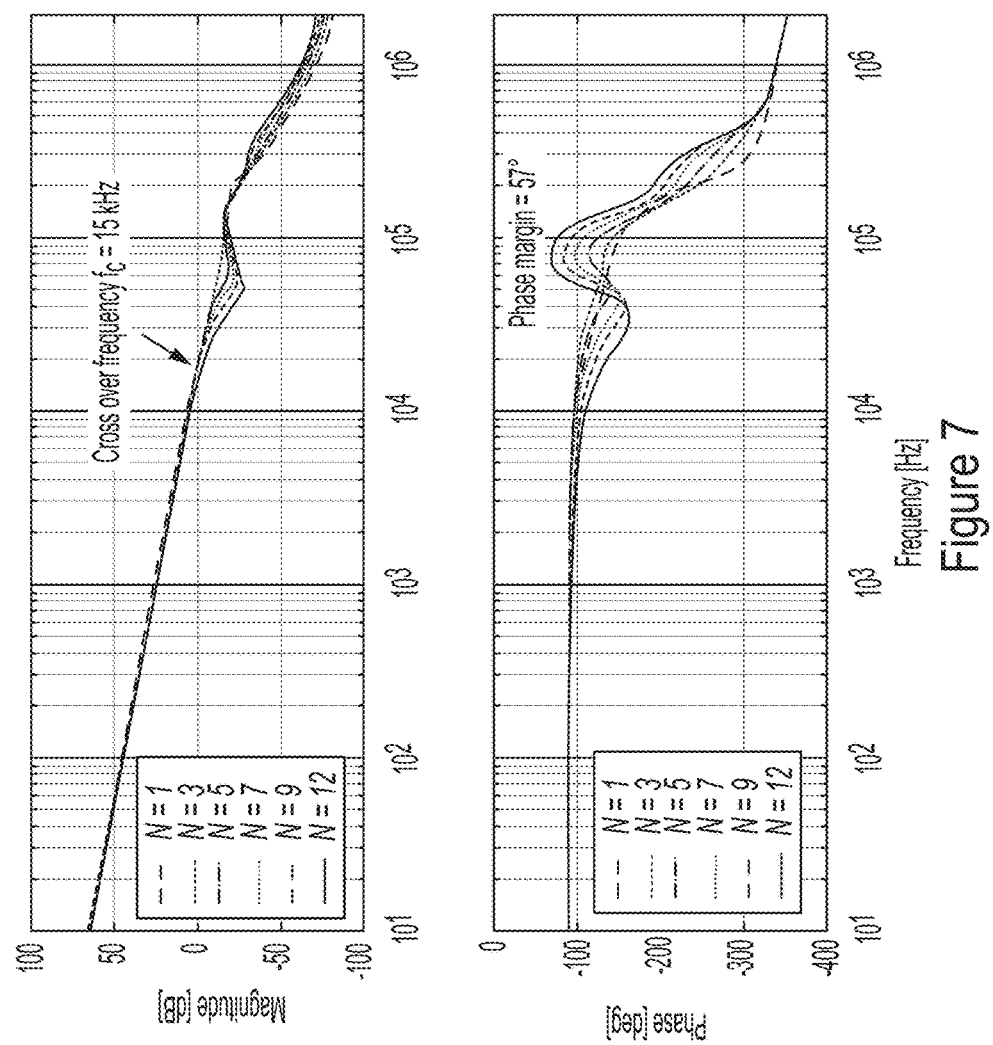
FIG. 7 illustrates a simulated loop gain for different LED configurations.
Figure 8:
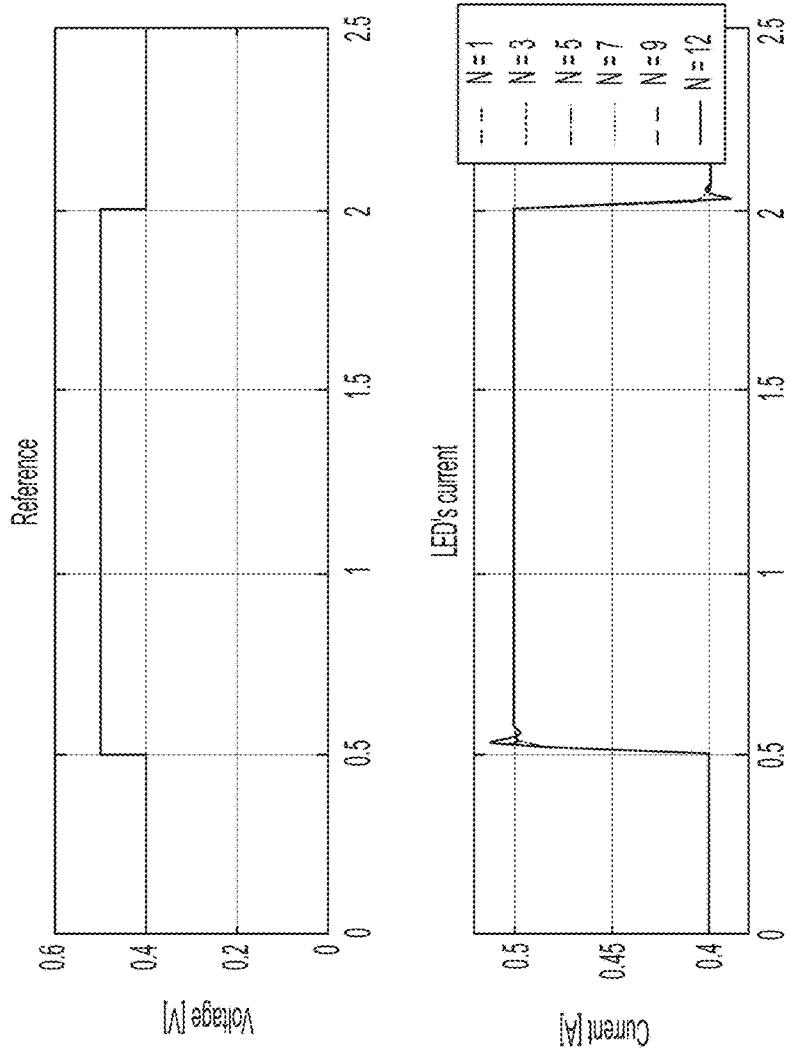
FIG. 8 illustrates a step response for different LED configurations.

FIG. 7 illustrates a simulated loop gain for different LED configurations for the converter and the closed loop controller 610 of FIG. 6. Further, FIG. 8 illustrates the results of a transient simulation of the embodiment of FIG. 6 showing response of the converter's output (LED) current to a 100 mA positive step change in the current reference (from 400 mA to 500 mA), and a symmetric negative step change. This step response is shown for different LED configurations (ranging from N=1 (LED) to 12 (LEDs)) in FIG. 8. It can be seen that for all values of N, the LED current exhibits fast rise and fall times and small overshoots, with the maximum overshoot (less than 10%) occurring for the maximum number of LEDs.

Figure 9:
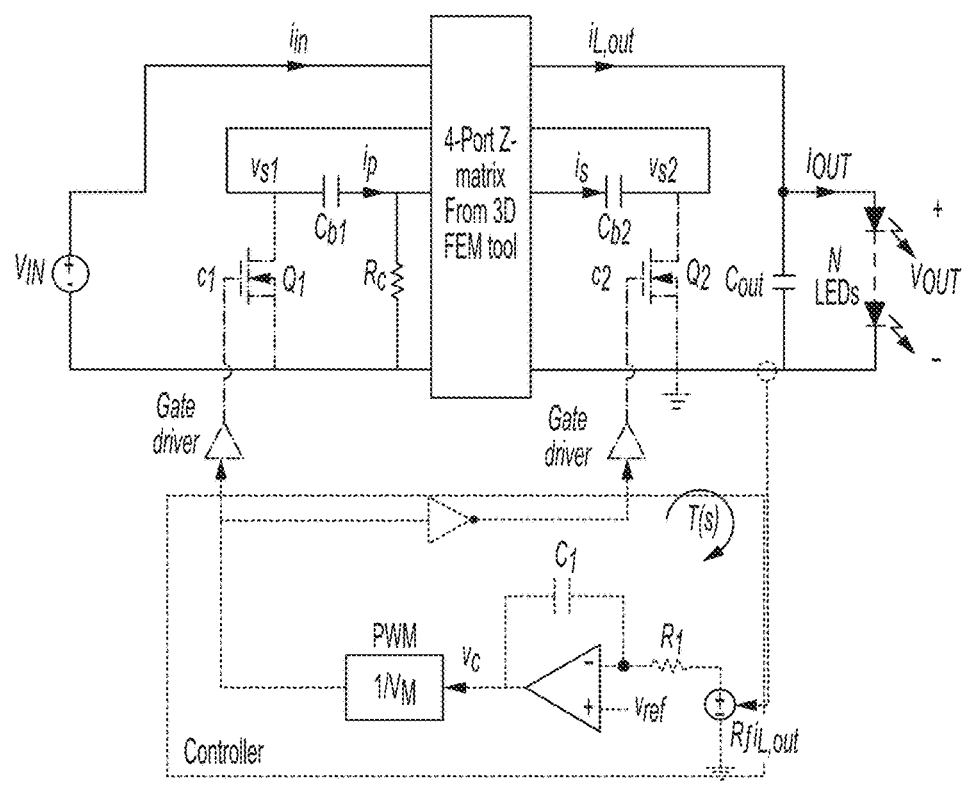
FIG. 9 illustrates a simulation for transient step responses using a converter circuit model.
Figure 10:
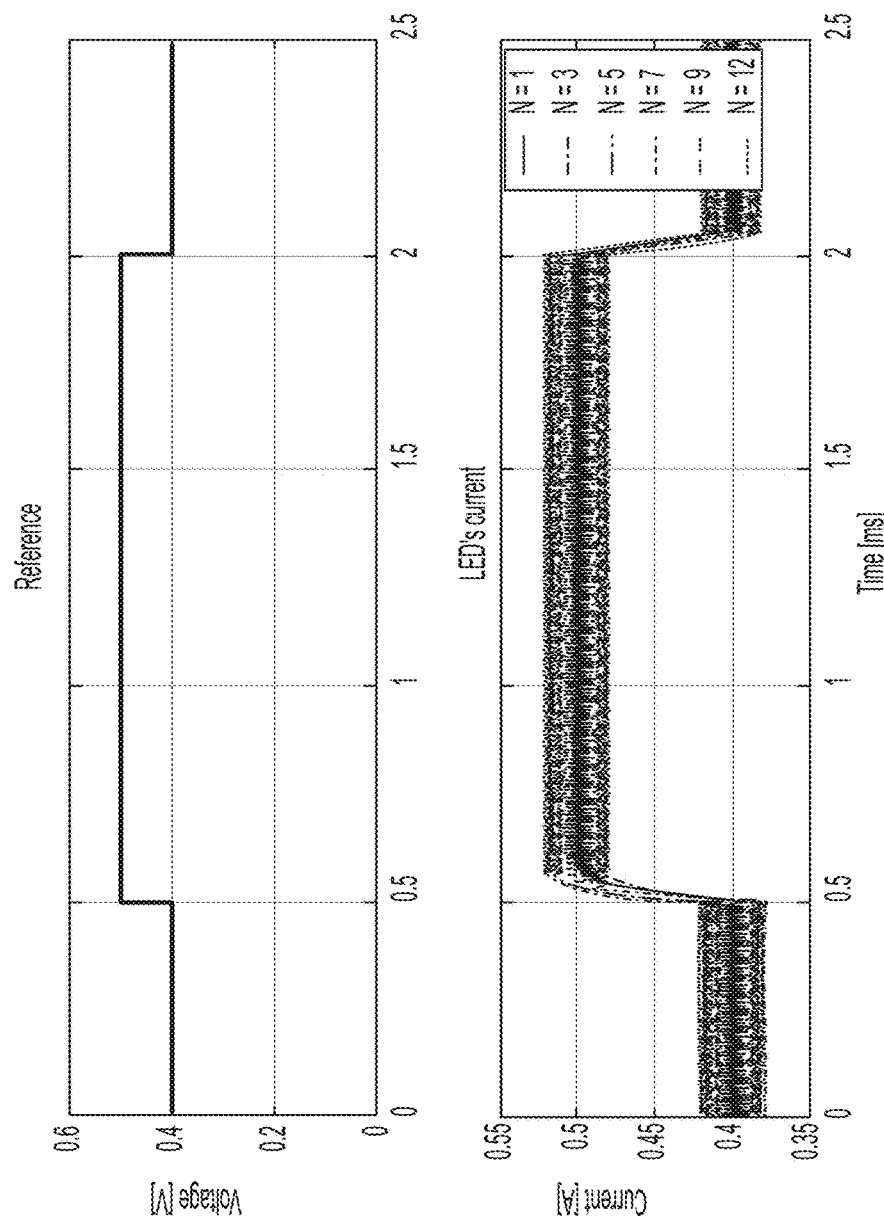
FIG. 10 illustrates a transient step response for different LED configurations.

FIG. 9 illustrates a simulation setup to perform transient step responses using a converter circuit model. The controller of FIG. 9 is tested using a SPICE™ switching circuit model including detailed subcircuit models of the switching devices $Q_1$ and $Q_2$. The transient step response using the detailed switch models for different operating points is shown in FIG. 10. As expected, switching ripple can now be observed in the LED current. The step response does not show any overshoot even in the worst-case scenario (N=12). This is due to the additional damping provided by the on-resistances of the transistors, which were neglected in the averaged switch model, but are now included in the transistor subcircuit definitions. Given this satisfactory transient response, the control architecture is extended to include PWM dimming functionality.

Figure 11:
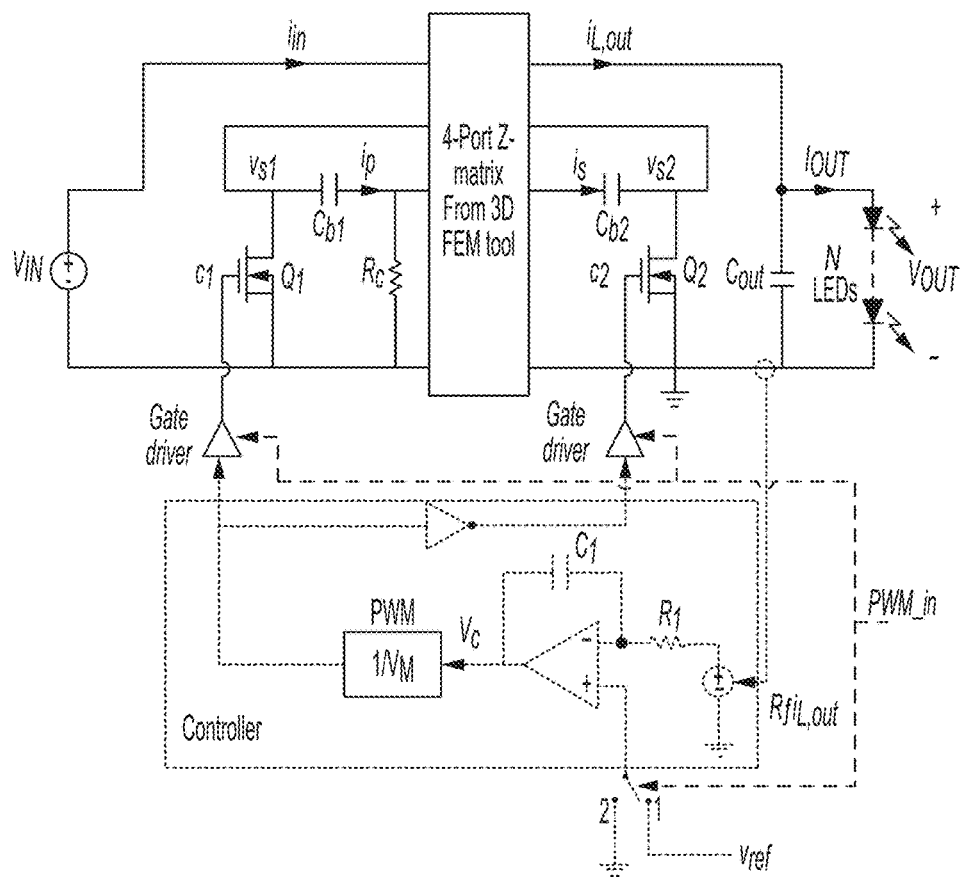
FIG. 11 illustrates a feedback controller according to embodiments of the disclosure.

PWM dimming functionality is added to the feedback controller by introducing a control input, PWM_in, as shown in FIG. 11. PWM_in is a pulsating signal with a duty cycle corresponding to the required LED brightness. The converter is turned on when this signal is high, and turned off when it is low. When the signal goes high, the gate drivers are enabled and the compensator reference input is set to $V_{ref} = R_s I_{ref}$. Conversely, when PWM_in goes low, the gate drivers are disabled and consequently the converter is shut down. At this time, the compensator reference input is set to zero and the converter's output voltage drops from its steady state value. This prevents any overshoot from occurring in the LED current in the next PWM dimming cycle when the PWM_n signal goes high again.

Figure 12A:
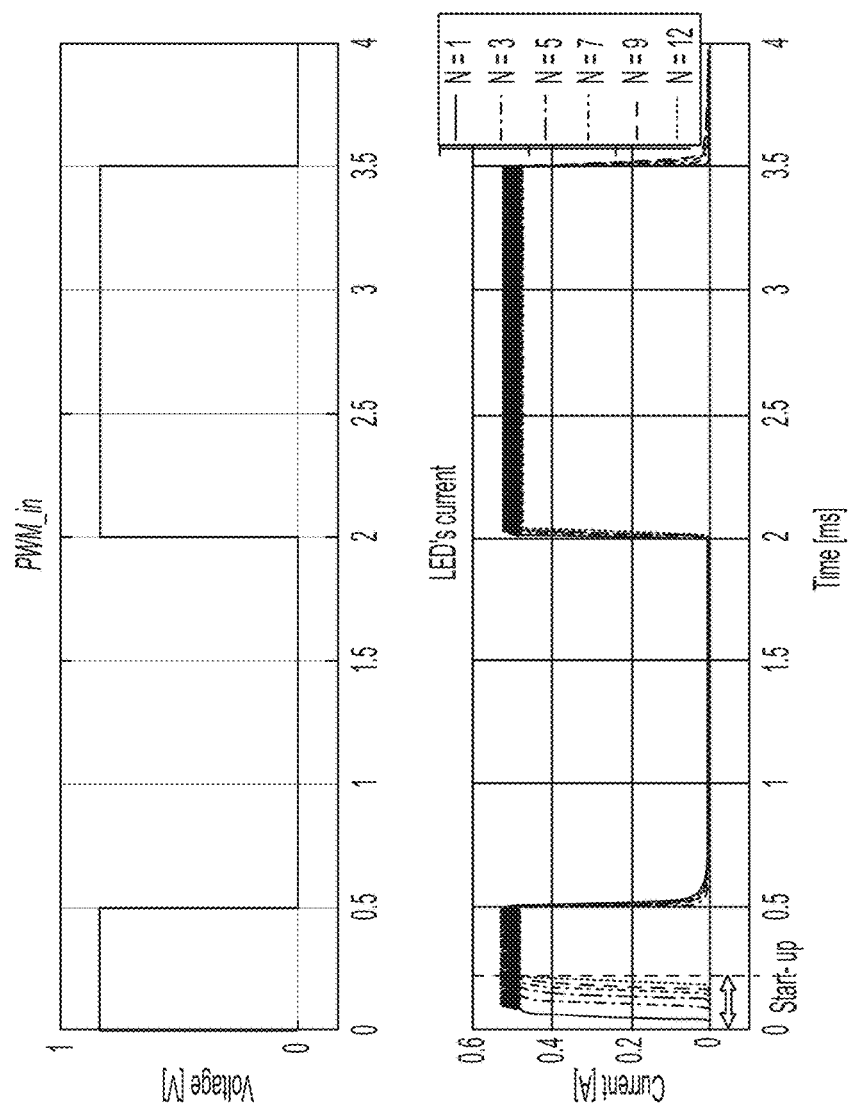
FIGS. 12a and 12b illustrate simulation results and performance of DC-to-DC driver according to one or more embodiments of the disclosure.

FIG. 12a illustrates the results of a transient SPICE™ simulation performed to verify this PWM dimming operation. The LED current time-aligned with the PWM_n signal is shown in FIG. 12a. The dimming frequency $f_{dim}$ is 1 kHz, and the dimming duty cycle $D_{dim}$ is 50%. The waveform also demonstrates the start-up behavior of the converter. It can be seen that the converter turns on and off with no overshoots or undershoots in the LED current.

Figure 12B:
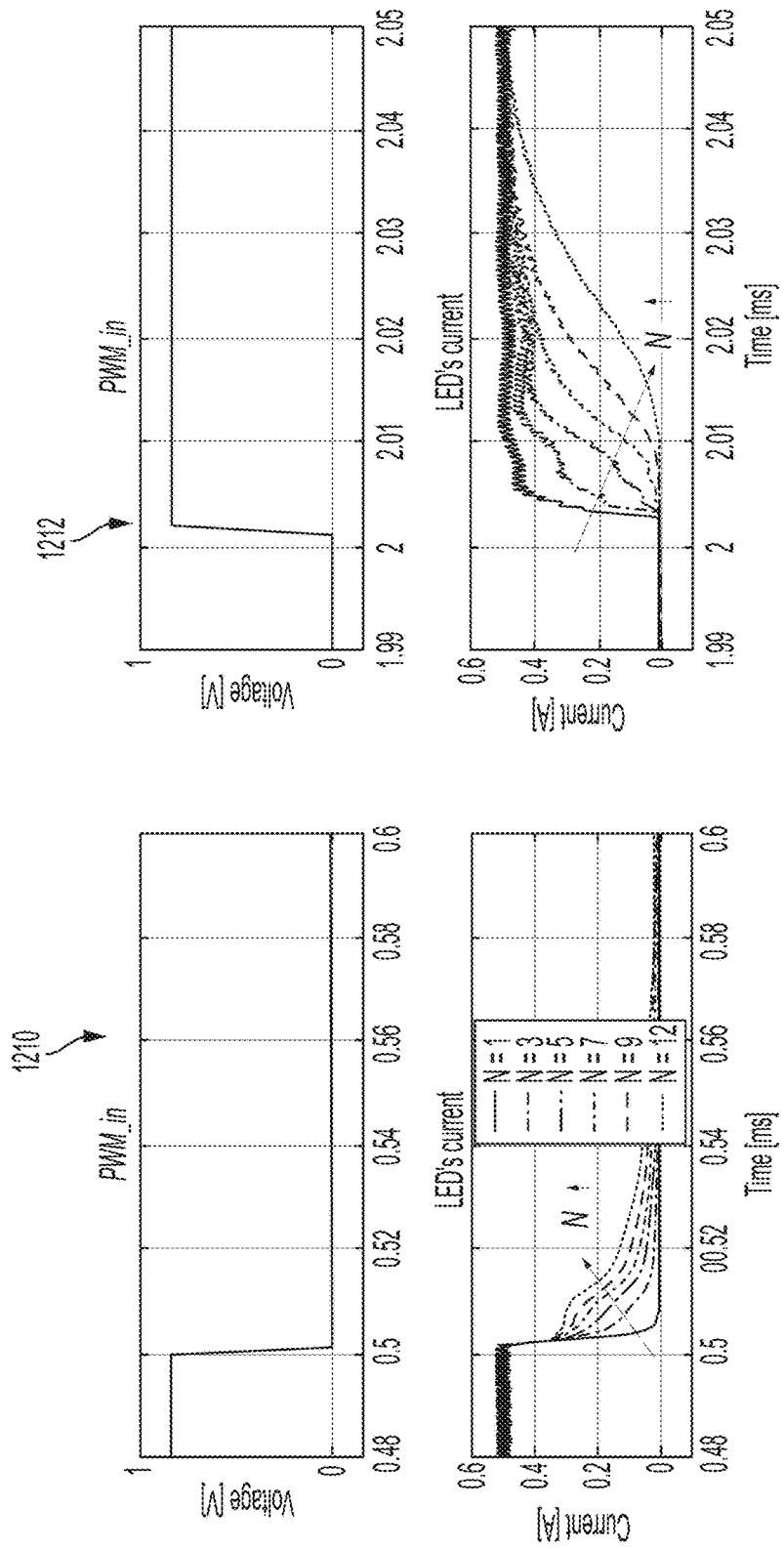

FIG. 12b illustrates PWM dimming performance LED current both in a zoomed-in turn-off transition (1210) and zoomed-in turn-on transition (1212). As can be seen, the turn-off time of the LED current is longest when the number of LEDs (N) is at the maximum, with a fall time $t_{off} \approx 40$ μs. Similarly, the turn-on time is also longest for the maximum number of LEDs ($t_{on} \approx 40$ μs).

Figure 13:
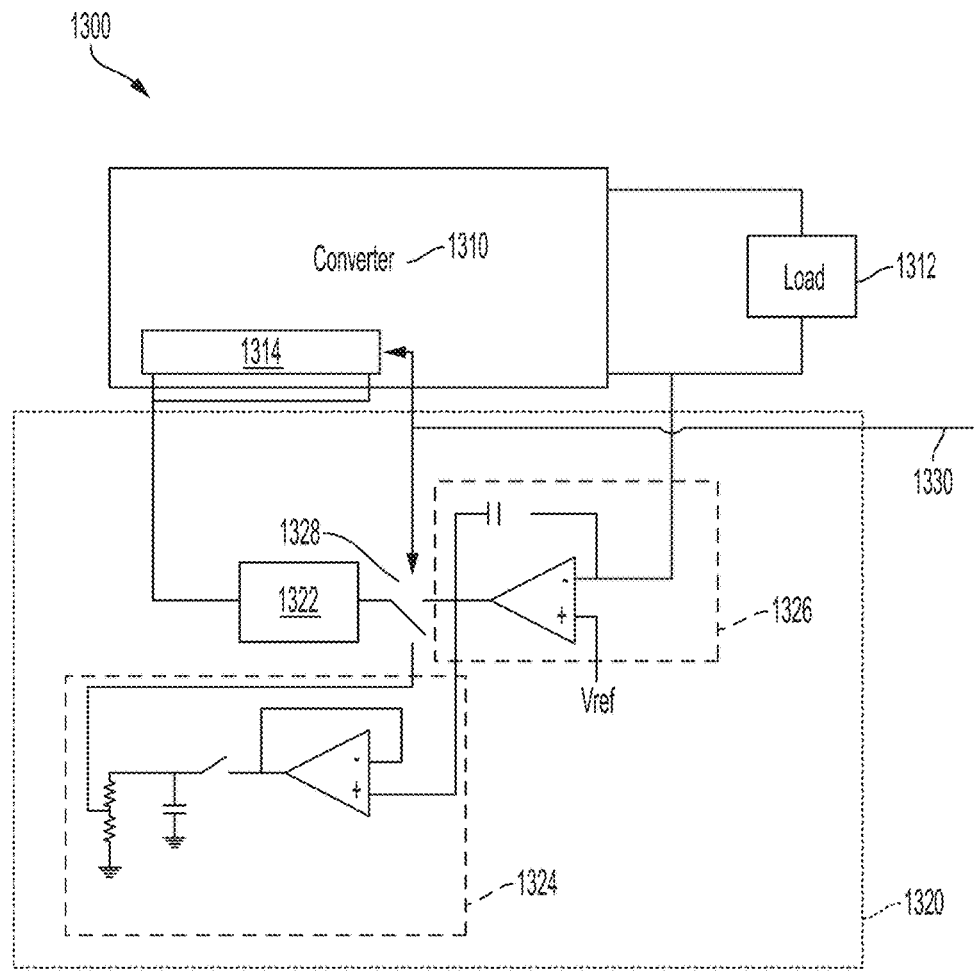
FIGS. 13 and 14 illustrate an embodiment of a DC-to-DC driver according to one or more embodiments of the disclosure.

FIG. 13 illustrates a DC-to-DC driver 1300 including a converter 1310 having an output configured to drive a load 1312 with an output current. The DC-to-DC driver 1300 further includes a feedback controller 1320 coupled to the controller 1310 and having a pulse-width modulator 1322, a switching mechanism 1328, a compensator 1326 and a sampler 1324.

In one embodiment, driver 1300 is configured as an LED driver for automotive applications. Further, the driver 1300 may be included within a lamp having one or more LEDs as the load.

The converter 1310 may be any type of DC-to-DC converter. For example, the converter 1310 may be an integrated magnetics Ćuk converter, buck converter, boost converter, buck-boost converter, noninverting buck-boost converter, Zeta converter, SEPIC, resonant converter, or the like.

Figure 14:
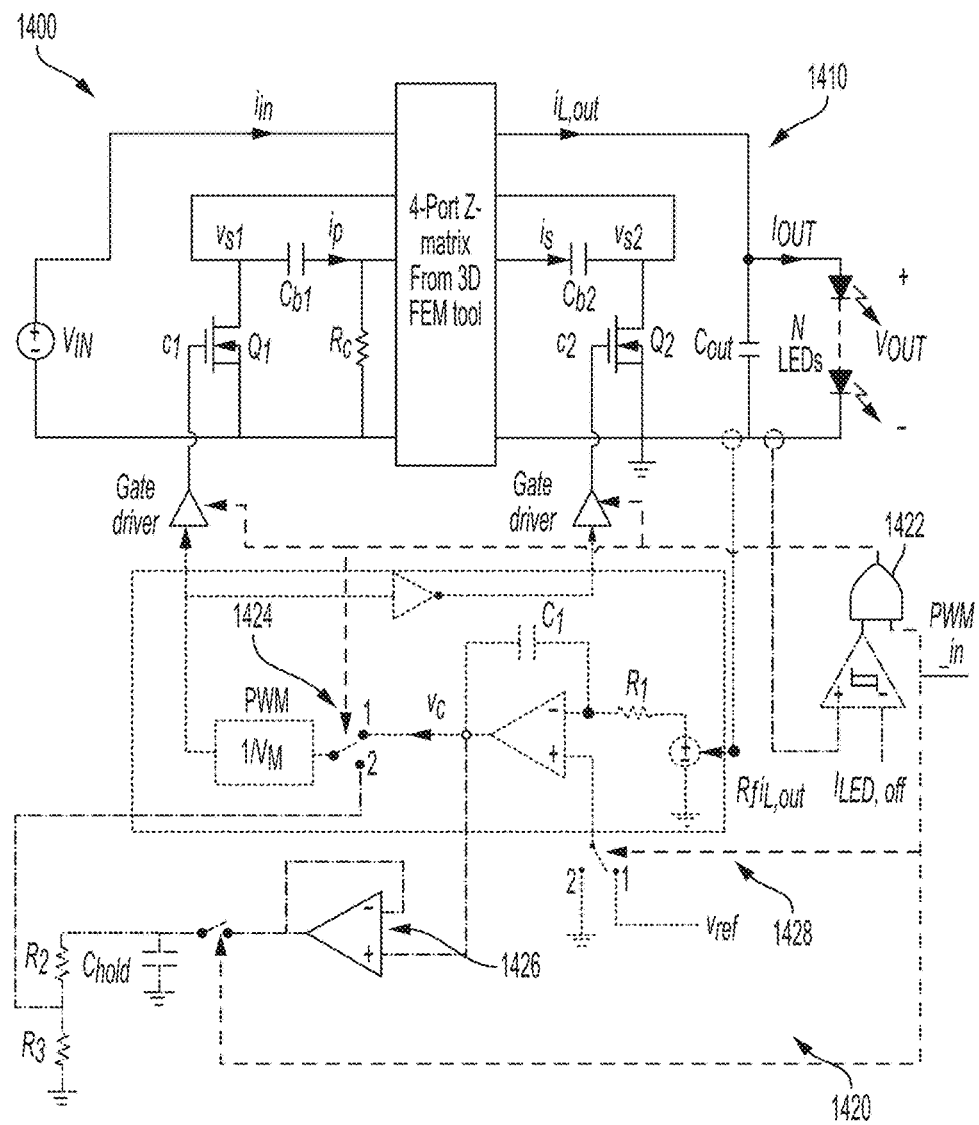
Figure 16:
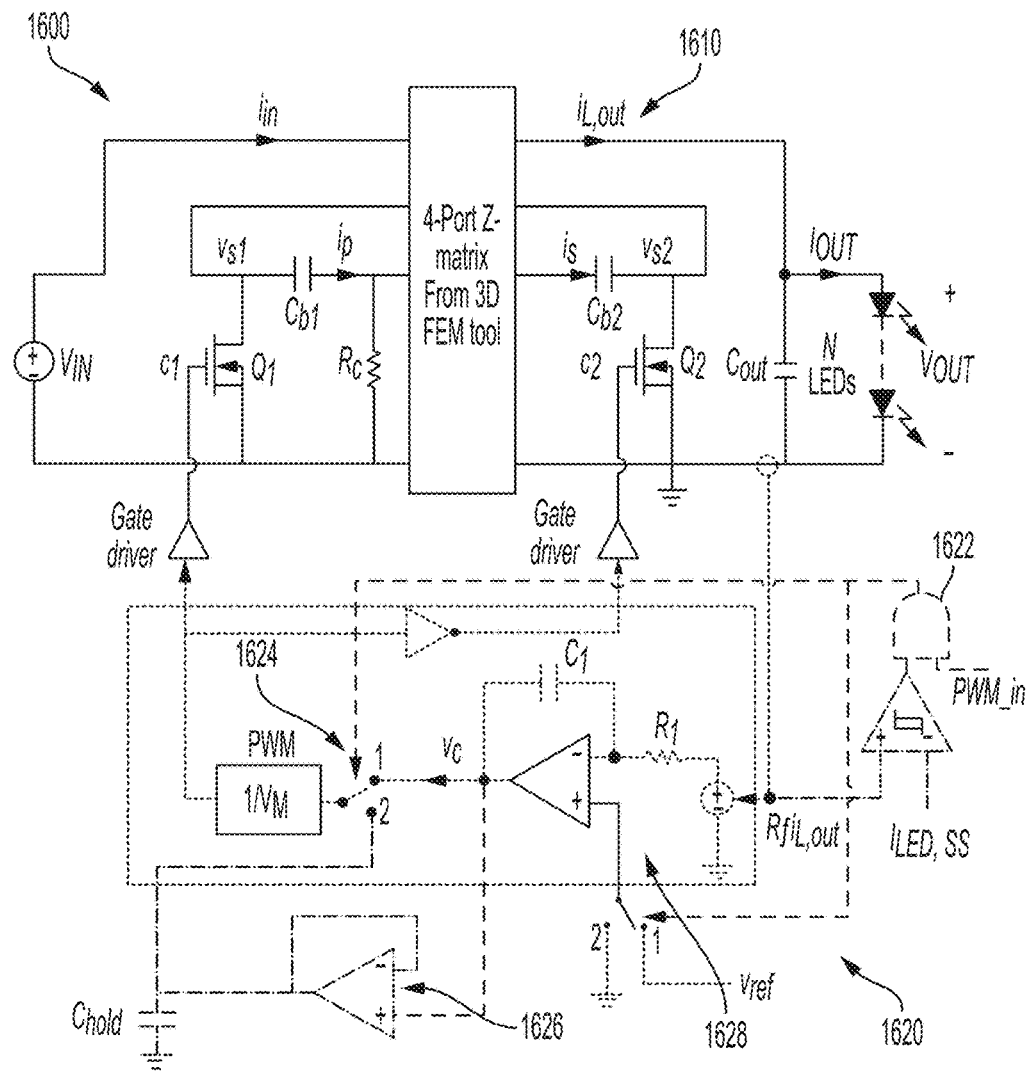
FIG. 16 illustrates an embodiment of a DC-to-DC driver according to one or more embodiments of the disclosure.

In one embodiment, the converter 1310 includes a switch network having a first operating state and a second operating state. Further, the switch network 1314 may be configured to selectively operate in the first operating state and the second operating state at least partially based on the dimming signal 1330. As illustrated in the embodiments of FIGS. 14 and 16, the switch network may include transistors $Q_1$ and $Q_2$ and corresponding gate drivers. In other embodiments, the switch network may include more than two transistors and corresponding gate drivers. In one embodiment, the dimming signal 1330 controls the state of the transistors $Q_1$ and $Q_2$. For example, the dimming signal 1330 may deactivate a gate driver such that the corresponding transistor is not turned on. In one or more embodiments, the dimming signal 1330 may reduce the gate driver signal such that it is below the turn on threshold voltage of the corresponding transistor.

In various embodiments, the load 1322 may be one or more LEDs. The number of LEDs driven by the converter 1320 may be variable. For example, the load 1322 may include a plurality of series-connected LEDs, wherein at least one of the LEDs may be "shorted" through the use of one or more switches such that it is configured not be driven by converter 1320. In other embodiments, the load 1322 may be a microprocessor, a memory, a digital circuit, an analog circuit, an RF circuit, a combination of different circuit types, or the like.

In one embodiment, the duty cycle of dimming signal 1330 is based on a parameter of the load 1312. For example, when the load 1312 is one or more LEDs, the duty cycle of dimming signal 1330 may be based on a desired brightness level of the LEDs. Further, the duty cycle may be further or alternatively based on the number of LEDs to be driven.

In various embodiments, an input of the pulse-width modulator 1322 is coupled to switching mechanism 1328 and is configured to output a pulse-width modulated signal to the converter 1320. The pulse-width modulated signal may be at least partially based on a duty-cycle control signal provided by one of the compensator 1326 and the sampler 1324. In one embodiment, the pulse-width modulator 1322 is configured to output the pulse-width modulated signal to switch network 1314. In one embodiment, the pulse-width modulated signal is applied to transistors of the switch network 1314 via corresponding gate drivers. Further, the pulse-width modulated signal may be inverted by an inverter before being provided to a gate driver.

In various embodiments, a pulse-width-modulated signal based on the duty cycle control signal of the compensator 1326 may have a duty cycle different than that of a pulse-width-modulated signal based on the duty cycle control signal of the sampler 1324. The duty cycle of a pulse-width-modulated signal based on the duty cycle control signal of the sampler 1324 may be a portion of a steady-state value of the duty cycle of a pulse-width-modulated signal based on the duty cycle control signal of the compensator 1326. For the example, a pulse-width-modulated signal based on the duty cycle control signal of the sampler 1324 may be any percentage less than 100% the duty cycle of a pulse-width-modulated signal based on the duty cycle control signal of the compensator 1326.

In one embodiment, the switching mechanism 1324 is coupled to the outputs of the compensator 1328 and the sampler 1326 and is configured to selectively couple one of the output of the compensator 1328 and the output of the sampler 1326 to in the input of pulse-width modulator 1322 based on a dimming signal 1330.

The compensator 1326 has a first input coupled to the output current of the converter 1320 and a second input coupled to a reference voltage. In one embodiment, the compensator 1326 is configured to generate a duty-cycle control signal based on a comparison of the output current signal and the reference voltage. As illustrated in FIGS. 14 and 16, the reference input of compensator 1326 may be selectively coupled by the dimming signal to a first reference voltage and a second reference voltage. The first reference voltage may be any reference voltage greater than second reference voltage. For example, the second reference voltage may be ground and the first reference voltage may be any voltage greater than ground.

In one or more embodiments, the sampler 1324 has an input coupled to the output of the compensator 1326 and is configured to generate a duty cycle control signal based on the duty cycle control signal generated by the compensator 1326. In various embodiments, the output of the sampler 1324 is controlled by dimming signal such that when switching element 1328 couples the output of the sampler 1324 to the pulse-width modulator 1322 and a corresponding duty cycle controlled signal is provided to the pulse-width modulator 1322, the pulse-width modulator generates a corresponding pulse-width modulated signal.

FIG. 14 illustrates a DC-to-DC driver 1400 including converter 1410 and feedback controller 1420. In the illustrated embodiment, feedback controller includes an off-state comparison network 1422 configured to generate a control signal based on a comparison of the output signal from the converter 1410 configured to generate a control signal based on a comparison of the output signal and a reference signal and a dimming signal.

In one embodiment, the off-state comparison network 1422 includes a comparator that compares output current to a reference current. The output of the comparator is then combined with the dimming signal (PWM_in signal) to generate a control signal. In one embodiment, the output of the comparator and the dimming signal are combined using a NOR gate. The control signal is provided to the gate drivers, switching mechanism 1424, sampler 1426, and compensator 1428.

In one embodiment, the control signal controls the switching mechanism 1424 to couple one of the output of the compensator 1428 or the sampler 1426 to the pulse width modulator. Further, the control signal may control the reference of the compensator 1428 to selectively couple either a first or second reference voltage.

In one embodiment, the control signal goes high when both the dimming signal and the output of the comparator are low. The control signal is provided to the gate drivers and switching mechanism 1424, turning off the gate drivers and coupling the output of sampler 1426 to the input of the pulse-width modulator.

Further, the dimming signal may control the output of the sampler 1426, such that the output switch of the sampler 1426 is closed when the output of the sampler is coupled to the pulse width modulator.

In various embodiments, the control signal controls the gate drivers such that the operating state of the switch network is changed. For example, the control signal may control the gate drives to provide a voltage to the gates of the corresponding transistors ($Q_1$, $Q_2$) to place the transistors in an "on" state or an "off" state.

In one or more embodiments, during an on-time of the dimming signal (e.g., when the dimming signal goes "high"), a steady-state value of the duty-cycle control signal provided by the compensator 1428 is sampled. During an off-time of the dimming signal (e.g., when the dimming signal goes "low"), the duty-cycle of the converter 1410 is set to a fraction of the steady-state value to reverse the power flow and to actively discharge the output capacitor of converter 1410. In response, in one embodiment, the load current (output signal) decays at a fast rate, and reaches zero when the output voltage falls below the forward drop of the load. Further, when the load current (output signal) reaches zero, the converter 1410 is turned off.

In one embodiment, the duty cycle of the converter 1410 is adjusted by controlling the input duty control signal to the pulse-width modulator. For example, to decrease the duty cycle of the converter, the duty cycle control signal of the sampler 1426 is provided to the pulse-width modulator instead of the duty cycle control signal of the compensator 1428.

Figure 15:
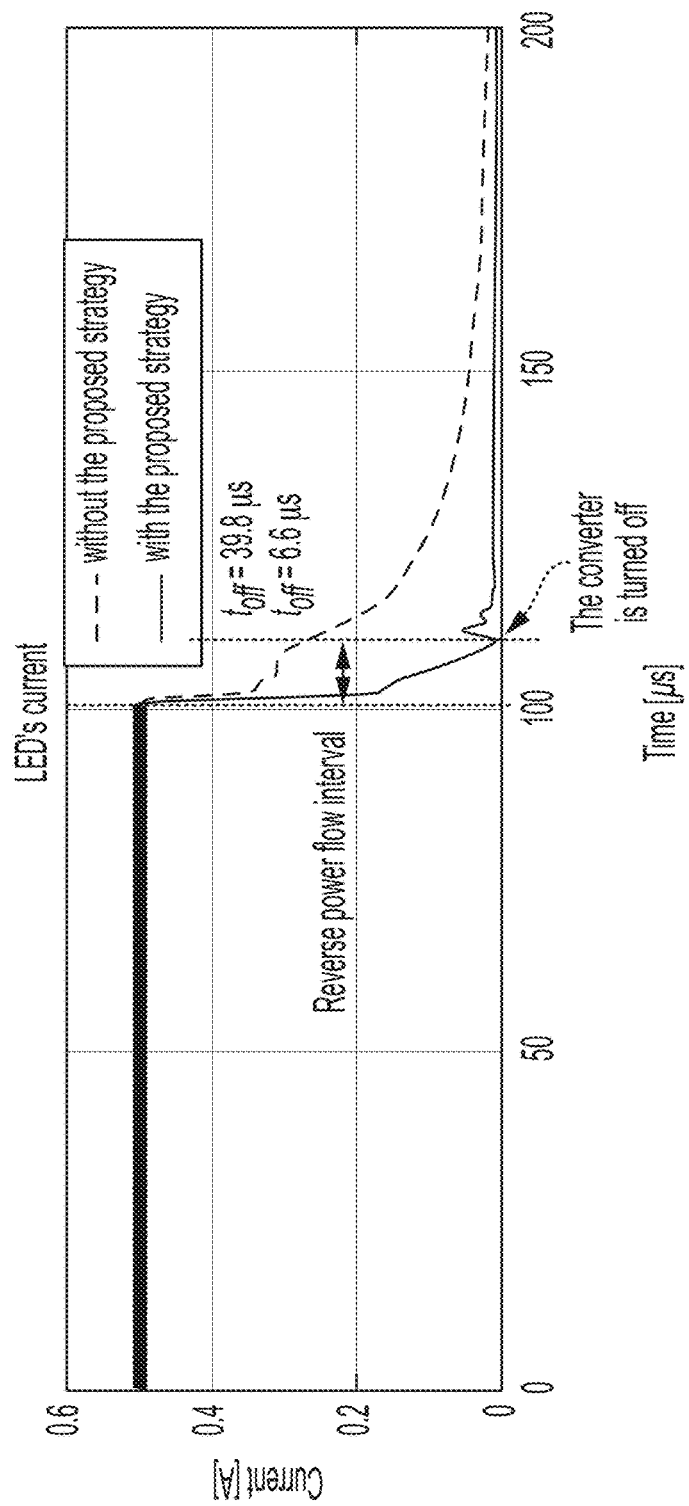
FIG. 15 shows turn-off times for a DC-to-DC driver according to one or more embodiments of the disclosure.

FIG. 15 shows the turn-off time transitions of LED currents with and without the elements of claim 14. It can be seen that with the elements of claim 14, the fall time of the LED current is improved by up to 82% (from 39.8 µs to 6.6 µs) for $V_{IN}$=12 V and $V_{OUT}$=40 V (N=12).

FIG. 16 illustrates a DC-to-DC driver 1600 including converter 1610 and feedback controller 1620. In the illustrated embodiment, feedback controller includes a steady-state comparison network 1622 configured to generate a control signal based on a comparison of the output signal from the converter 1610 configured to generate a control signal based on a comparison of the output signal and a reference signal and a dimming signal.

In one embodiment, the steady-state comparison network 1622 includes a comparator that compares output current to a reference current. The output of the comparator is then combined with the dimming signal (PWM_in signal) to generate a control signal. In one embodiment, the output of the comparator and the dimming signal are combined using an AND gate. The control signal is provided to the switching mechanism 1624, sampler 1626, and compensator 1628.

In one embodiment, the control signal controls the switching mechanism 1624 to couple one of the outputs of the compensator 1628 or the sampler 1626 to the pulse-width modulator. Further, the control signal may control the reference of the compensator 1628 to selectively couple either a first or second reference voltage.

In one embodiment, the control signal goes high when both the dimming signal and the output of the comparator are high. The control signal is provided to the compensator 1628 coupling the reference of the compensator to ground and provided to the switch mechanism 1624 coupling the output of sampler 1626 to the input of the pulse-width modulator.

In various embodiments, when the converter 1610 is turned off, the output of the compensator 1628 is held to a value slightly below its steady-state value, and the compensator 1628 output is disconnected from the pulse-width modulator and the output of the sampler is coupled to the input of the pulse-width modulator.

Further, when the dimming signal goes high, the converter 1610 is commanded with the steady-state value of the duty cycle.

As the load current builds up at a fast rate, when the load current reaches the vicinity of its steady state value, the output of the stead-state comparator goes high and the compensator 1628 is re-connected to the pulse width modulator and current regulation loop is re-established. Further, when the load current reaches its steady-state value, the duty cycle control signal is sampled by sampler 1626 and stored to be used during turn-off.

Figure 17:
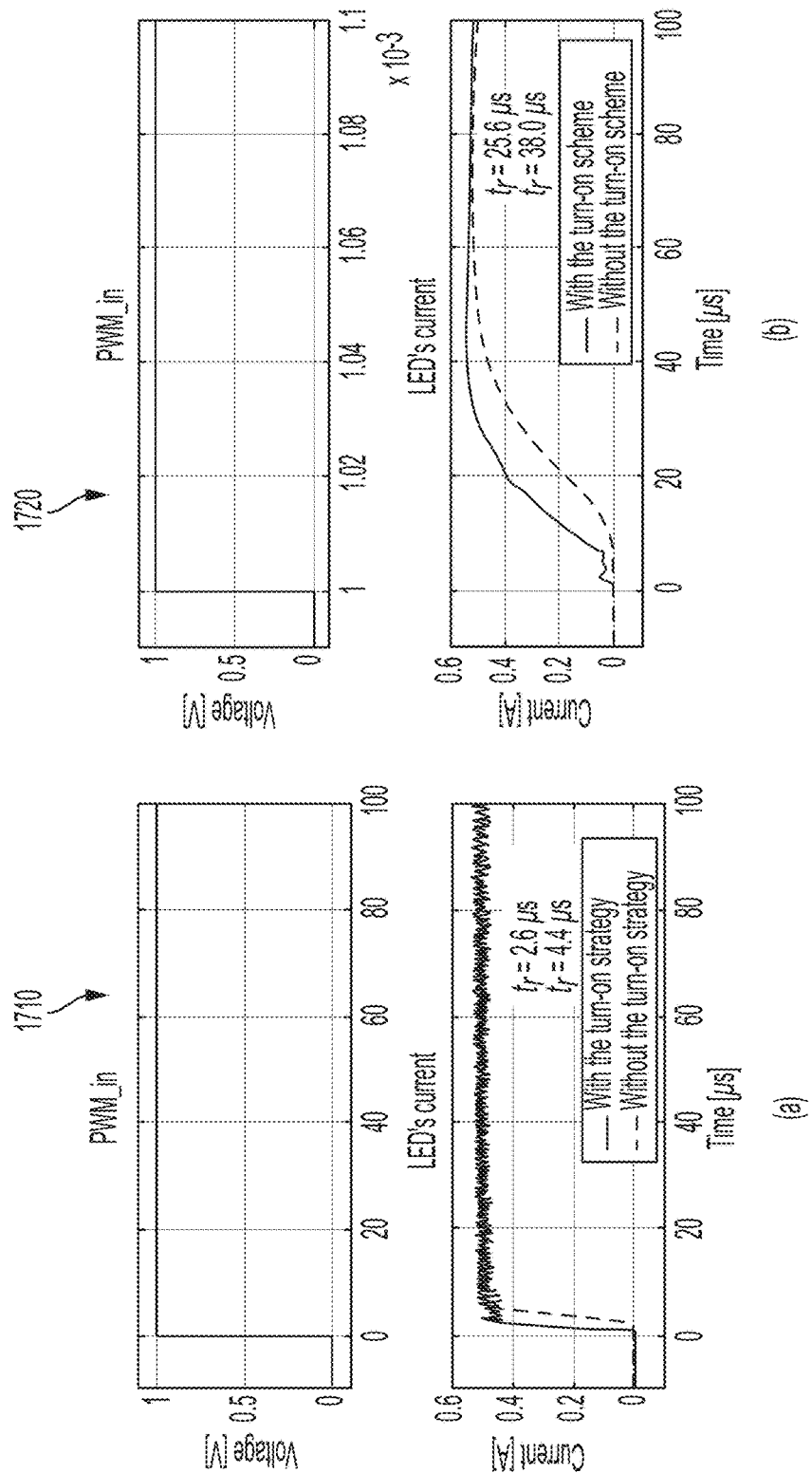
FIG. 17 shows turn-on times for a DC-to-DC driver according to one or more embodiments of the disclosure.

Turn-on transitions of the LED current with and without the elements of the embodiment of FIG. 16 are shown in FIG. 17. It can be seen in 1710 that the turn-on time is improved by up to 43% (4.4 µs to 2.2 µs) for $V_{IN}$=12 V, $V_{OUT}$=3 V (N=1). As shown in 1720, the turn-on time is improved by up to 32% (38.0 µs to 25.6 µs) for $V_{IN}$=12 V, $V_{OUT}$=40 V (N=12).

Figure 18:
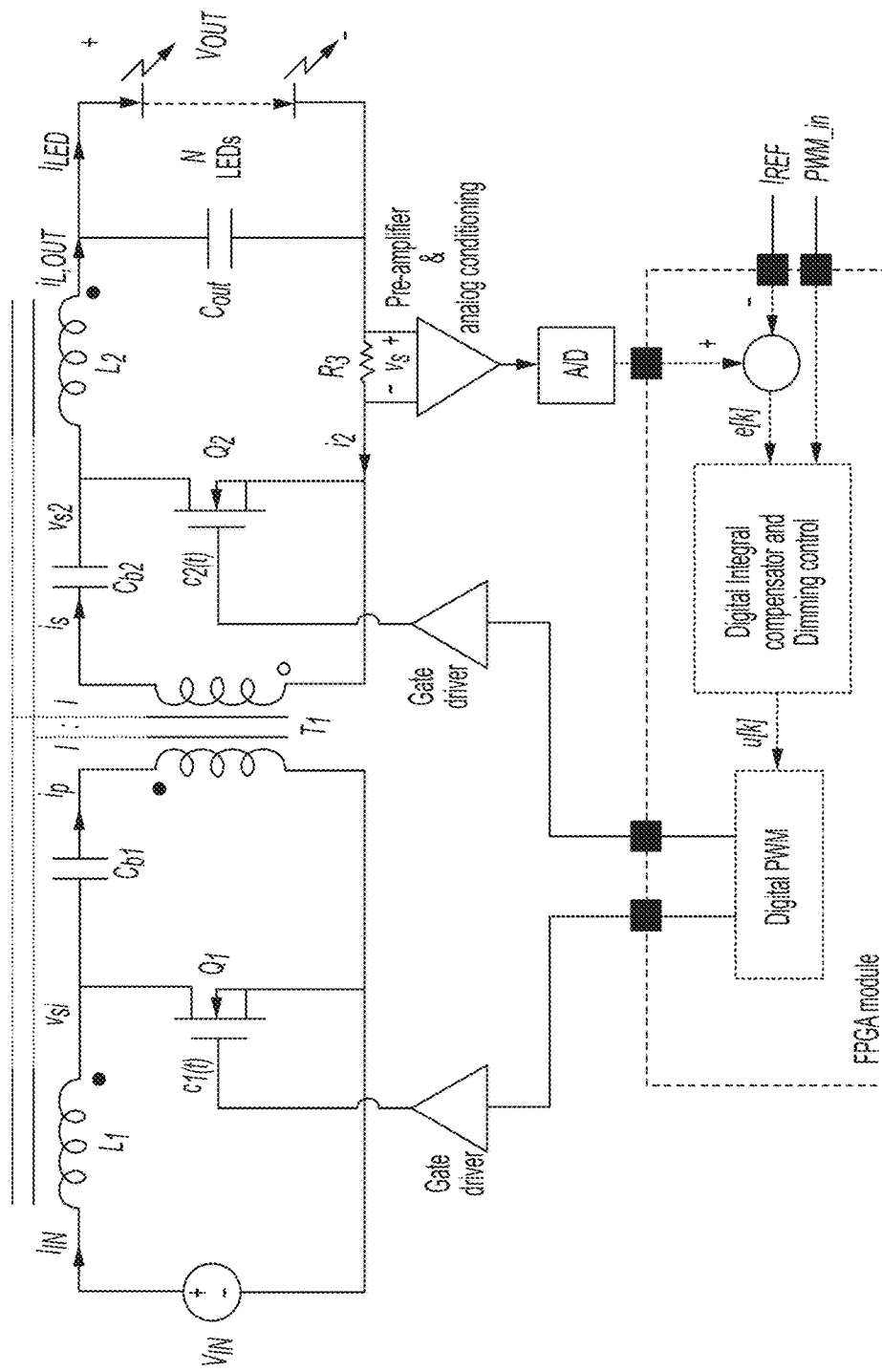
FIG. 18 illustrates a DC-to-DC driver having a feedback controller according to one or more embodiments of the disclosure.

FIG. 18 illustrates a DC-to-DC driver having a feedback controller with PWM dimming functionality as is described above and an integrated magnetics Ćuk. In one embodiment, a FPGA module may be used to provide high-resolution switching PWM duty cycle signals. In other embodiments, a specialized analog, digital or mixed-signal controller chip may be used to provide high-resolution switching PWM duty cycle signals. The PWM dimming signal, PWM in, is provided using a signal generator and the current reference Iref is set thorough an interface command to the FPGA console. In one or more embodiment, the dimming signal may also be provided by another controller. The output inductor current, iL,out, is sensed using a sense resistor Rf. The sensed current is fed into a preamplifier and preconditioned using a low-pass filter with a cut-off frequency set to 1 MHz to attenuate switching noise. In one embodiment, a 12-bit differential ADC with a sampling frequency of 50 MHz is used to sample the sensed and filtered current. The sampled current may be transferred into the FPGA using GPIO ports.

Figure 19:
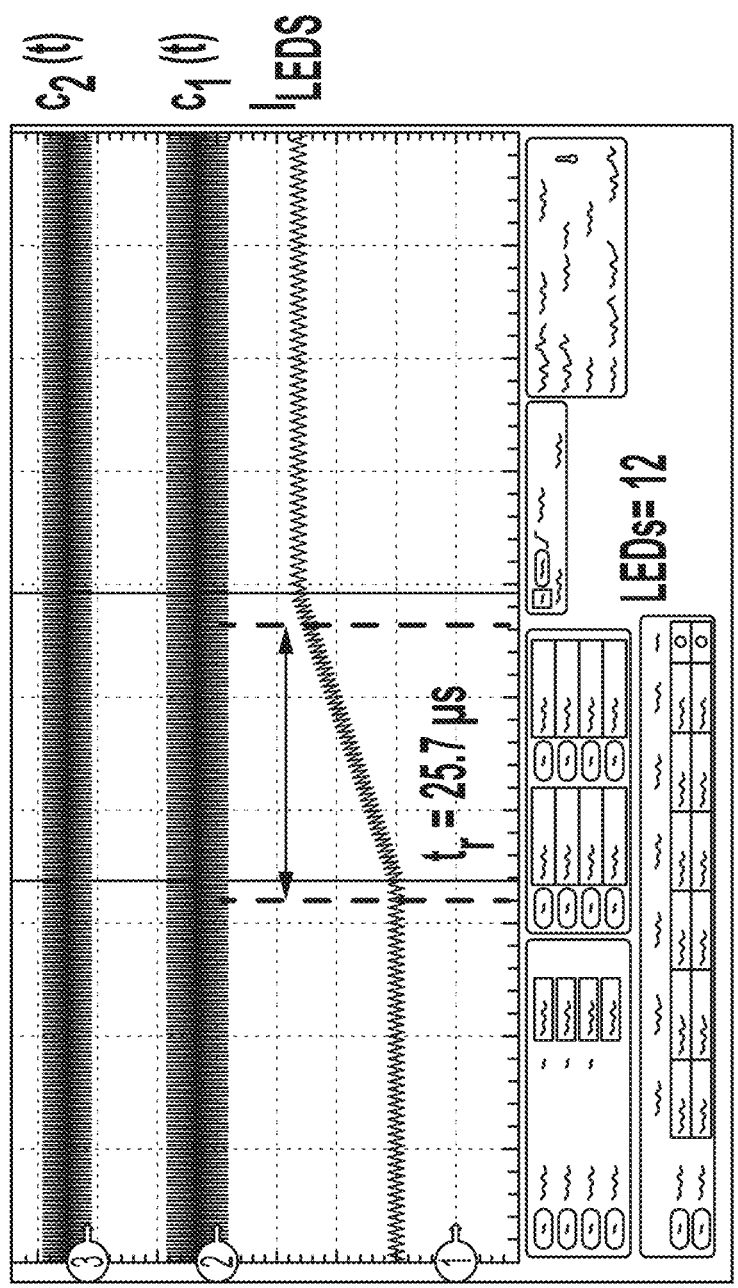
FIG. 19 illustrates current response for a DC-to-DC driver according to one or more embodiments of the disclosure.

A digital pulse-width modulator may provide two separate control signals, which are used by the converter gate drivers to generate the two gate-control signals $c_1(t)$ and $c_2(t)$, corresponding to the two transistors $Q_1$ and $Q_2$, respectively. The LED (load) current response to a 250 mA step change in the reference current is measured and shown for $V_{IN}$=12 V, $V_{OUT}$=40 V (N=12) in FIG. 19. It can be seen that the LED current rises without any overshoot.

Figure 20:
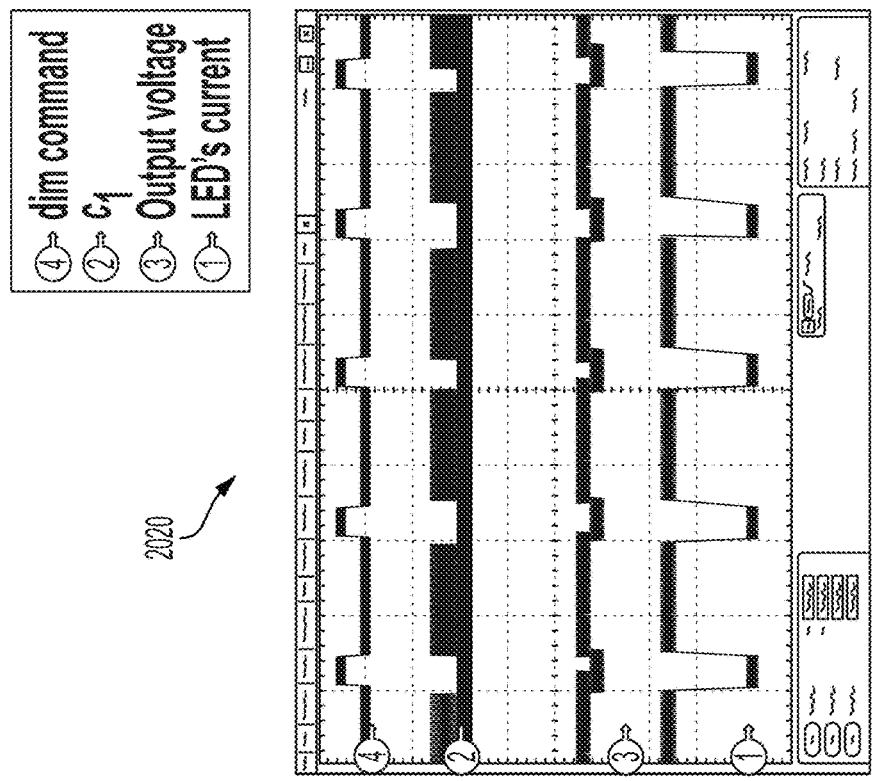
FIG. 20 illustrates dimming performance for a DC-to-DC driver according to one or more embodiments of the disclosure.
Figure 20:
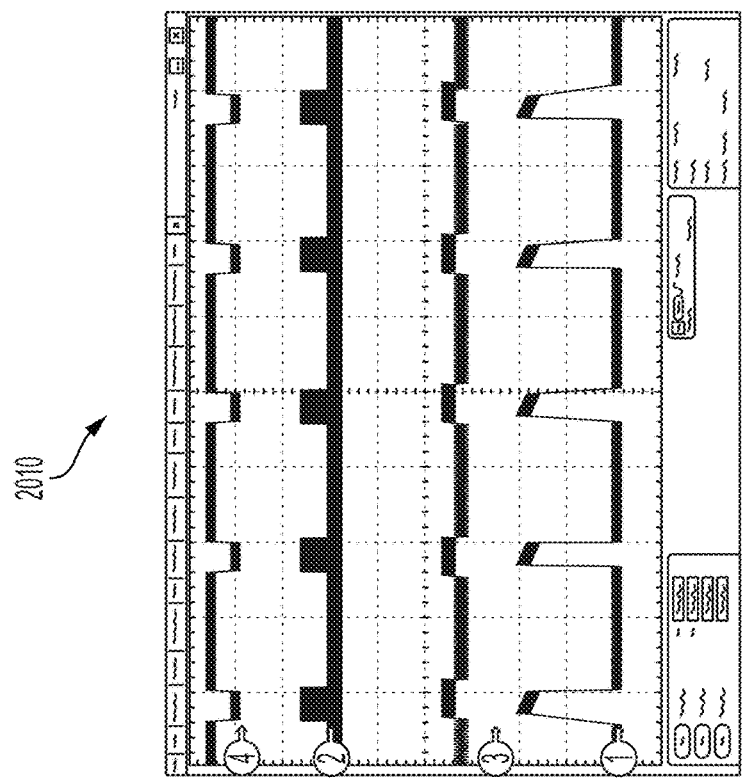
Figure 21:
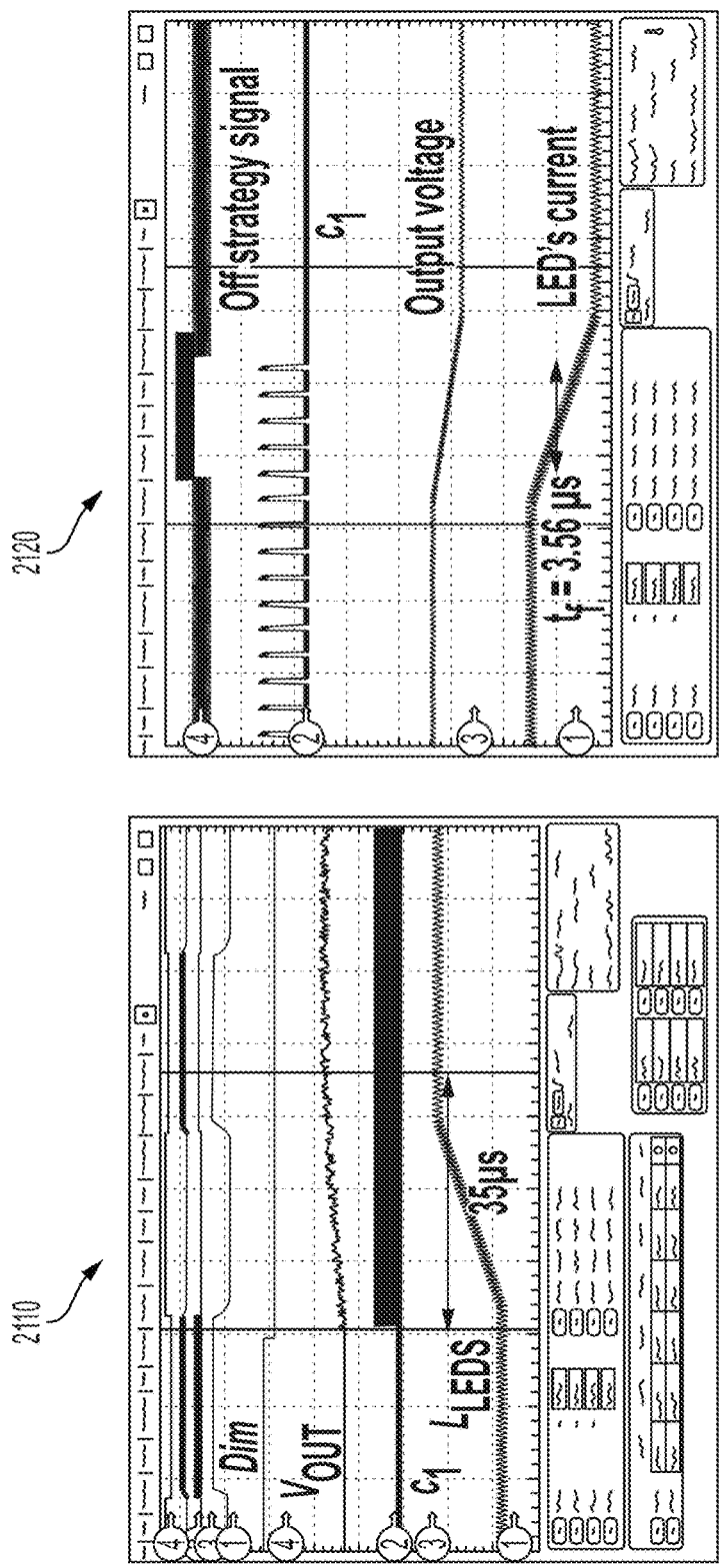
FIG. 21 illustrates turn-on and turn-off transitions of LED current according to one or more embodiments of the disclosure.

Measured PWM dimming performance for a dimming frequency fdim=1 kHz and for two dimming duty cycles, $D_{dim}$=20% and $D_{dim}$=80%, is shown in FIG. 20, graphs 2010 and 2020 respectively. Turn-on and turn-off transitions of the LED current are shown in FIG. 21 for two example operating points. It can be observed from 2110 that at $V_{IN}$=12 V and $V_{OUT}$=40 V (N=11), the LED current rises from 0 to 0.5 A in 35 μs. In graph 2120, it is shown that at $V_{IN}$=12 V and $V_{OUT}$=15 V (N=5), the LED current drops from its steady state value, 0.5 A, to 0 in less than 4 μs.

In various embodiments, a DC-to-DC driver is designed to achieve a high bandwidth, such as 15 kHz, and an adequate worst-case phase margin, such as 57°. In various embodiments, the feedback controller of the driver precisely regulates the average output inductor current, and hence the load current, over the entire output voltage range of the converter (3 V to 50 V). The architecture of the feedback controller may be enhanced to include fast PWM dimming functionality. To enable high-resolution PWM dimming, feedback controllers 1620 and 1820 and corresponding turn-on and turn-off strategies may be employed. In one embodiment, the proposed turn-off strategy and feedback controller 1620 reduces the fall time of the load current by up to 83%, while the turn-on strategy and feedback controller 1820 reduces the rise time by up to 40%. In various embodiments, the feedback controller and the turn-off and turn-on schemes may be implemented in a digital fashion using an FPGA, in an analog fashion using a custom integrated circuit, in a mixed-signal fashion using a custom integrated circuit, or the like.

These and other advantages maybe realized in accordance with the specific embodiments described as well as other variations. It is to be understood that the above description is intended to be illustrative, and not restrictive. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

The invention claimed is:

1. A DC-to-DC driver comprising:
a converter comprising an output configured to drive a load with an output current; and
a feedback controller coupled to the converter and comprising:
a pulse-width modulator configured to output a first pulse-width modulated signal to the converter;
a first switching mechanism coupled to the pulse-width modulator;
a compensator having an output coupled to the first switching mechanism, the compensator configured to generate a first duty cycle control signal based on a comparison of the output current and a first reference voltage; and
a sampler having an input coupled to the output of the compensator and an output coupled to the switching mechanism, the sampler configured to generate a second duty cycle control signal based on the first duty cycle control signal;
wherein the switching mechanism selectively couples one of the compensator and the sampler with the pulse-width modulator based at least in part on a dimming signal.

2. The driver of claim 1, wherein the converter further comprises a switch network comprising a first operating state and a second operating state and configured to selectively operate in the first operating state and the second operating state at least partially based on the dimming signal.

3. The driver of claim 1, wherein the dimming signal comprises a duty cycle based on a parameter of the load.

4. The driver of claim 1, wherein:
the pulse-width modulator generates the first pulse-width modulated signal based on the first duty cycle control signal and
the pulse-width modulator is configured to generate a second pulse-width modulated signal based on the second duty cycle control signal.

5. The driver of claim 1, further comprising a steady state comparison network comprising a second comparator configured to compare the output current with a steady state reference current and generate a steady state output signal.

6. The driver of claim 1, wherein the comparator comprises a reference input selectively coupled to the first reference voltage and a second reference voltage, and wherein the reference input is switched from being selectively coupled to the second reference voltage to the first reference voltage based at least in part on the dimming signal.

7. The driver of claim 1, wherein the converter is an integrated magnetics Ćuk converter.

8. A lighting system comprising:
one or more light emitting diodes (LEDs); and
the driver of claim 1 electronically coupled to and configured to drive the one or more LEDs.

9. The driver of claim 2, wherein the pulse-width modulator is configured to output the first pulse-width modulated signal to the switch network.

10. The driver of claim 2, wherein the switch network comprises:
a first transistor having a first gate;
a second transistor having a second gate; and
at least one gate driver coupled to the first gate and the second gate,
wherein:
in the first operating state, the first gate and the second gate are driven by the at least one gate driver; and
in the second operating state, the first gate and the second gate are driven below a turn-on voltage for the transistor.

11. The driver of claim 2, further comprising an off-state comparison network comprising a first comparator configured to compare the output current to a reference current, wherein the switch network is configured to switch from operating in the first operating state to operating in the second operating state at least partially based on the comparison and the dimming signal.

12. The driver of claim 3, wherein the load is one or more light-emitting diodes (LEDs) and the parameter is a brightness level.

13. The driver of claim 4, wherein the first pulse-width modulator signal comprises a first duty cycle and the second pulse-with modulation signal comprises a second duty cycle different than the first duty cycle.

14. The driver of claim 5, wherein the switching mechanism selectively couples one of the comparator and the sampler with the pulse-width modulator based on the dimming signal and further based on the steady state output signal.

15. The driver of claim 13, wherein the second duty cycle is a portion of a steady state value of the first duty cycle.

16. A method for driving a load with an output signal via a DC-to-DC driver, the method comprising:
   comparing the output signal with a first reference signal;
   generating a first control signal based on the comparison of the output signal and the first reference signal and a dimming signal; and
   switching from outputting to a converter of the DC-to-DC driver a first pulse-width modulated signal having a first duty cycle to outputting a second pulse-width modulated signal having a second duty cycle different than the first based on the first control signal.

17. The method of claim 16, wherein the first pulse-width modulated signal is based on a first duty cycle control signal and the second pulse-width modulated signal is based on a second duty cycle control signal.

18. The method of claim 16, further comprising: sampling a steady state value of the first duty cycle control signal and generate the second pulse-width modulated signal based on the steady state value.

19. A lighting system comprising:
   one or more light emitting diodes (LEDs); and
   a DC-to-DC driver executing the method of claim 16, the DC-to-DC driver electronically coupled to and configured to drive the one or more LEDs.

20. A DC-to-DC driver comprising:
   a converter comprising an output coupled to a load, and having a first operating state and a second operating state, the converter configured to drive the load with an output current; and
   a feedback controller coupled to converter and configured to selectively output a first pulse-width modulated signal and a second pulse-width modulated signal to the converter and receive a dimming signal, wherein the first pulse-width modulated signal comprises a first duty cycle and the second pulse-width modulated signal comprises a second duty cycle different than the first duty cycle;
   wherein:
      the converter is configured to switch from operating in the first state to operating in the second state based at least in part on the dimming signal; and
      the feedback controller is configured to selectively output the first pulse-width modulated signal and the second pulse-width modulated signal at least partially based on dimming signal.

* * * * *